(12) United States Patent
Nakasugi et al.

(10) Patent No.: US 7,435,978 B2
(45) Date of Patent: Oct. 14, 2008

(54) SYSTEM, METHOD AND A PROGRAM FOR CORRECTING CONDITIONS FOR CONTROLLING A CHARGED PARTICLE BEAM FOR LITHOGRAPHY AND OBSERVATION, AND A PROGRAM AND METHOD FOR MANUFACTURING A SEMICONDUCTOR DEVICE

(75) Inventors: Tetsuro Nakasugi, Kanagawa (JP); Takumi Ota, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 566 days.

(21) Appl. No.: 11/239,428

(22) Filed: Sep. 30, 2005

(65) Prior Publication Data

US 2006/0076508 A1 Apr. 13, 2006

(30) Foreign Application Priority Data

Oct. 13, 2004 (JP) ............................ 2004-298681

(51) Int. Cl.
*H01J 37/153* (2006.01)
(52) U.S. Cl. .............................. 250/492.22; 250/492.1; 250/492.2; 250/492.21; 250/492.3; 702/85; 702/94
(58) Field of Classification Search ............. 250/492.1, 250/492.2, 492.22, 492.21, 492.3; 702/85, 702/94
See application file for complete search history.

(56) References Cited

U.S. PATENT DOCUMENTS 4,879,473 A * 11/1989 Zumoto et al. ............ 250/492.2
6,657,207 B2 * 12/2003 Kawata et al. ............ 250/492.2

FOREIGN PATENT DOCUMENTS

| JP | 7-58015 | 3/1995 |
| JP | 7-122536 | 5/1995 |
| JP | 2786660 | 5/1998 |
| JP | 3064375 | 5/2000 |
| JP | 2003-124110 | 4/2003 |

* cited by examiner

*Primary Examiner*—Jack I. Berman
*Assistant Examiner*—Michael Maskell
(74) *Attorney, Agent, or Firm*—Finnegan, Henderson, Farabow, Garrett & Dunner, L.L.P.

(57) ABSTRACT

A system for correcting a charged particle beam lithography condition including: an error calculation unit configured to calculate an error in an illumination position of a charged particle beam, the charged particle beam is controlled by a lithography condition corrected by initial correction parameters; a temporary correction unit configured to calculate temporary correction parameters to decrease the error to a minimum; and a main correction unit configured to calculate main correction parameters correcting the lithography condition, by executing statistical processing using the temporary correction parameters and the initial correction parameters.

20 Claims, 20 Drawing Sheets

SYSTEM, METHOD AND A PROGRAM FOR CORRECTING CONDITIONS FOR CONTROLLING A CHARGED PARTICLE BEAM FOR LITHOGRAPHY AND OBSERVATION, AND A PROGRAM AND METHOD FOR MANUFACTURING A SEMICONDUCTOR DEVICE

CROSS REFERENCE TO RELATED APPLICATIONS AND INCORPORATED BY REFERENCE

The application is based upon and claims the benefit of priority from the prior Japanese Patent Applications No. P2004-298681, filed on Oct. 13, 2004; the entire contents of which are incorporated herein by reference.

BACKGROUND OF THE INVENTION

1. Field of the Invention

The present invention relates to technology for manufacturing a semiconductor device, more particularly, to a system, a method and a program for correcting a charged particle beam lithography condition or beam observation condition of a semiconductor pattern, and a method for manufacturing a semiconductor device by use of a charged particle beam lithography.

2. Description of the Related Art

Miniaturization of a semiconductor integrated circuit has been accompanied by providing a higher accuracy of exposing and observing technologies of a semiconductor pattern. In the exposure technology, the miniaturization of the semiconductor integrated circuit has been accompanied by an increase in importance of a charged particle beam drawing device, which uses charged particle beams such as electron beams (EB) or focused ion beams (FIB). Stable operation, high throughput, and a microfabrication performance are required of the charged particle beam drawing device.

However, there is a limit to processing or assembling accuracy of components of the charged particle beam drawing device. When charged particle beams are used for drawing, a deflection distortion caused by a deflector for deflecting the charged particle beams may cause displacement (error) between an actual illumination position of the charged particle beams and a desired illumination position (target position) initially scheduled during a design stage. To accurately control the illumination position of the charged particle beams, it is important to correct lithography conditions and the like to correct displacement (error) of the illumination position.

As a method for correcting the illumination position of the charged particle beams, for example, there is a known method for adjusting a transmission current of an aperture of the charged particle beam drawing device to correct a mechanical rotational error of a molding deflector.

There is also a known method for adjusting a lens of the charged particle beam drawing device. The following lens adjusting methods are known: adjusting a current value of the lens to detect reflected electrons, transmitted electrons, secondary electrons, or light obtained when a mark arranged on a stage is scanned with a projected image of a batch exposure aperture, thereby providing a graphical correlation between the mark and the aperture; a method for measuring a graphic dimension on a lens image surface to be defined for magnification; a method for obtaining a position of a graphic form on a lens image surface to adjust a magnification, rotation or distortion of the lens, and the like.

There is an additionally known method for correcting positional deviation of charged particle beams by a deflection system which positions charged particle beams on a sample surface.

Furthermore, there is a known method for moving a mark into an area in which charged particle beams are deflected, and detecting the mark to correct a deflection gain (deflection sensitivity) based on a set deflection amount, a stage position, and a relation of the detected mark position.

According to the method for correcting the illumination position of the charged particle beams, the charged particle beams are applied to calculate a correction parameter based on an error or the like, and correcting lithography conditions by using the correction parameter. However, the influence of external differences, such as noise, during the application of the charged particle beams may make it impossible to calculate an optimal value of the correction parameter. As a consequence, the drawing accuracy of the charged particle beams may be deteriorated.

SUMMARY OF THE INVENTION

An aspect of the present invention inheres in a system for correcting a charged particle beam lithography condition includes: an error calculation unit configured to calculate an error in an illumination position of a charged particle beam, the charged particle beam is controlled by a lithography condition corrected by initial correction parameters; a temporary correction unit configured to calculate temporary correction parameters to decrease the error to a minimum; and a main correction unit configured to calculate main correction parameters correcting the lithography condition, by executing statistical processing using the temporary correction parameters and the initial correction parameters.

Another aspect of the present invention inheres in a system for correcting a charged particle beam observation condition includes: an error calculation unit configured to calculate an error in an illumination position of a charged particle beam observing a surface of a substrate, the charged particle beam is controlled by an observation condition corrected by initial correction parameters; a temporary correction unit configured to calculate temporary correction parameters to decrease the error to a minimum; and a main correction unit configured to calculate main correction parameters correcting the observation condition by executing statistical processing using the temporary correction parameters and the initial correction parameters.

An additional aspect of the present invention inheres in a computer implemented method for correcting a charged particle beam lithography condition includes: calculating an error in an illumination position of a charged particle beam, the charged particle beam is controlled by a lithography condition corrected by initial correction parameters; calculating temporary correction parameters to decrease the error to a minimum; and calculating a main correction parameter correcting the lithography condition, by executing statistical processing using the temporary correction parameters and the initial correction parameters.

A further additional aspect of the present invention inheres in a program configured to be executed by a computer for executing an application of a system for correcting a charged particle beam lithography condition, the program includes: instructions for calculating an error in an illumination position of a charged particle beam, the charged particle beam is controlled by a lithography condition corrected by initial correction parameters; instructions for calculating temporary correction parameters to decrease the error to a minimum;

and instructions for calculating main correction parameters correcting the lithography condition, by executing statistical processing using the temporary correction parameters and the initial correction parameters.

A further additional aspect of the present invention inheres in a method for manufacturing a semiconductor device includes: coating a resist film on a semiconductor wafer; calculating an error in an illumination position of a charged particle beam, the charged particle beam is controlled by a lithography condition corrected by initial correction parameters, calculating temporary correction parameters to decrease the error to a minimum, calculating main correction parameters, by executing statistical processing using the temporary correction parameters and the initial correction parameters; correcting the lithography condition using the main correction parameters; and exposing the resist film by use of a corrected charged particle beam controlled by the corrected lithography condition.

DETAILED DESCRIPTION OF THE INVENTION

Figure 1:
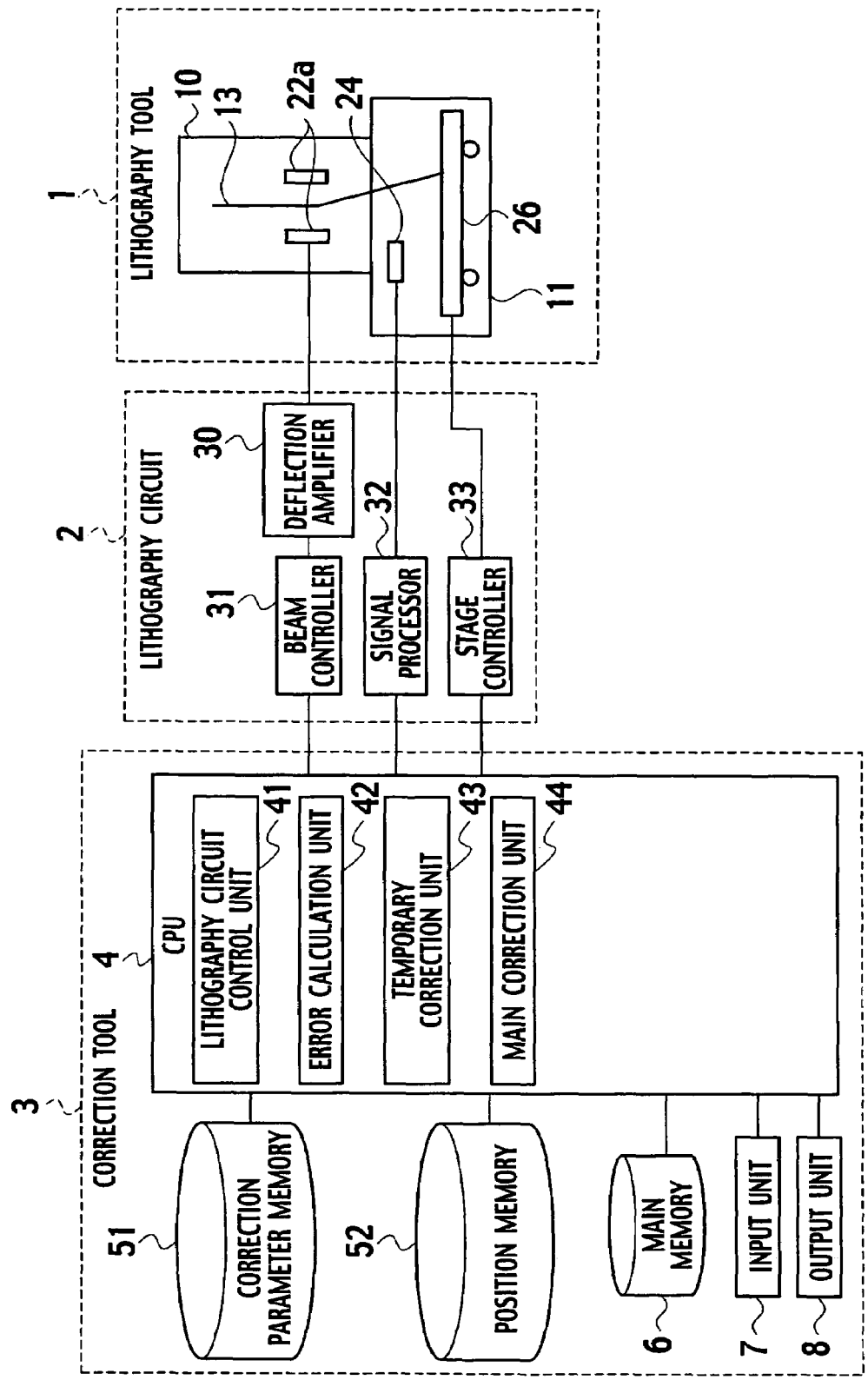
FIG. 1 is a schematic view showing an example of an electron beam drawing device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The embodiments of the present invention will be described by way of example of an electron beam drawing device (electron beam exposure device) which uses electron beams. However, explanation similar to that of the electron beam drawing device can be applied to an ion beam drawing device which uses ion beams. Moreover, the present invention can be applied to a device for exposing a semiconductor pattern, e.g., an optical exposure device which uses an excimer laser or ultraviolet rays, and an X-ray exposure device which uses X-rays.

As shown in FIG. 1, a correction tool 3 according to the embodiment of the present invention includes: a correction parameter memory 51 for storing an initial correction parameter to correct lithography conditions of electron beams; an error calculation unit 42 for calculating an error in an illumination position of a electron-beam, the electron beam is controlled by the lithography conditions corrected by using the initial correction parameters; a temporary correction unit 43 for calculating temporary correction parameters to decrease errors to a minimum; and a main correction unit 44 for calculating main correction parameters for correcting the lithography condition by executing statistical processing by using the temporary correction parameters and the initial correction parameters to correct the lithography conditions. The error calculation section 42, the temporary correction unit 43, and the main correction unit 44 are included in a central processing unit (CPU) 4.

An electron beam drawing device shown in FIG. 1 includes a lithography tool 1, a lithography circuit 2 and the correction tool 3. The lithography tool 1 includes an optical tube 10 and a sample chamber 11.

Figure 2:
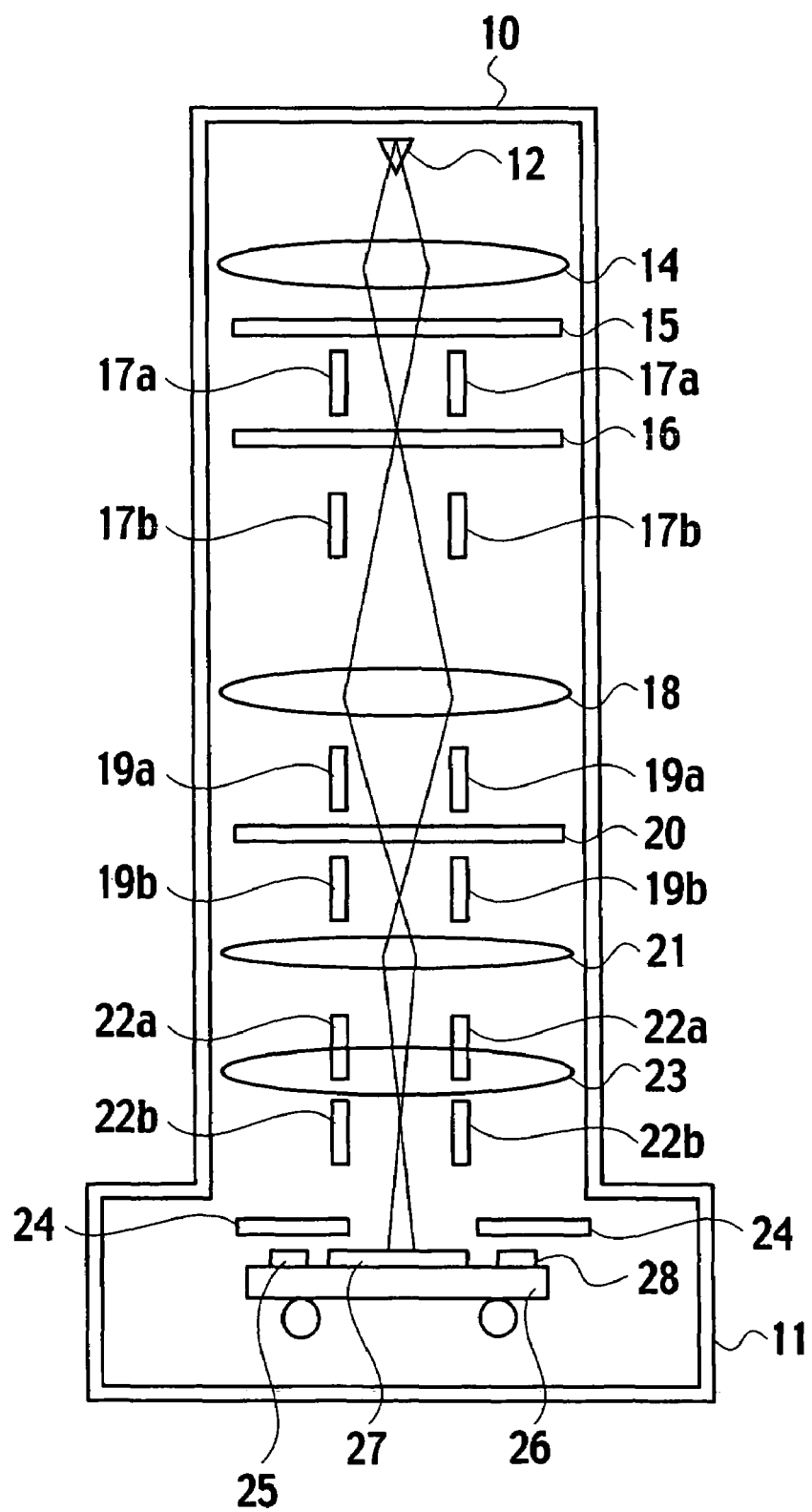
FIG. 2 is a schematic view showing an example of a lithography tool according to the embodiment of the present invention.

As shown in FIG. 2, the lithography tool 1 inside of the optical tube 10 includes: an electron gun 12, a condenser lens 14, first and second shaping apertures 15 and 20, a blanking aperture 16, blanking deflectors 17a and 17b, a projection lens 18, character projection (CP) selection deflectors 19a and 19b, a demagnification lens 21, an objective lens 23, and objective deflectors 22a and 22b.

The electron gun 12 generates an electron beam. The condenser lens 14 adjusts illumination conditions of the electron beam. The first and second shaping apertures 15 and 20 form the electron beam into a desired shape. The blanking aperture 16 turns on/off the electron beam. The blanking deflectors 17a and 17b deflect the electron beam onto the blanking aperture 16. The projection lens 18 forms an image plane on the second shaping aperture 20. The CP selection deflectors 19a and 19b control the degree of optical superposition by the first and second shaping apertures 15 and 20 by selecting a pattern (character) of the first and second shaping aperture 15 and 20. The demagnification lens 21 and the objective lens 23 allow the electron beam to form an image on the mark mount (reference chip) 25 or the sample 27. The objective deflectors 22a and 22b control an illumination position of the electron beam.

Coils and electrostatic deflectors can be used for the CP selection deflectors 19a and 19b, and the objective deflectors 22a and 22b, for example. Each of the objective deflectors 22a and 22b has a main deflector and a sub-deflector to achieve highly accurate deflection without decreasing the throughput, and has a plurality of deflection electrodes to minimize deflection errors.

Inside of the sample chamber 11: a mark mount 25 and a Faraday cup 28 for position detection, a detector 24 for detecting back-scattered electrons or secondary electrons from the mark mount 25 and the sample 27, and a stage 26 movable in X and Y directions.

A semiconductor substrate, or the like, made of silicon (Si) or the like and coated with a resist film, can be used as the sample 27 when a semiconductor device is manufactured. When an exposure mask is fabricated, a glass plate, or the like, coated with a resist film can be used as the sample 27.

Current density of an electron beam generated by the electron gun 12 is adjusted to a desired density by the condenser lens 14, and the first shaping aperture 15 is evenly illuminated by the electron beam. The electron beam passing through the first shaping aperture 15 is then directed onto the second shaping aperture 20 by the projection lens 18. The electron beam formed by the optical superposition of the first and second shaping apertures 15 and 20 forms an image on the sample 27 through the demagnification lens 21 and the objective lens 23. The objective deflectors 22a and 22b form an electrical field in accordance with a deflection voltage applied by the beam deflection circuit 34, whereby the electron beam is deflected. When moving the sample 27, the electron beam is deflected to the blanking aperture 16 by use of the blanking deflectors 17a and 17b so that an inappropriate part of the sample 27 will not be exposed to light.

Figure 3:
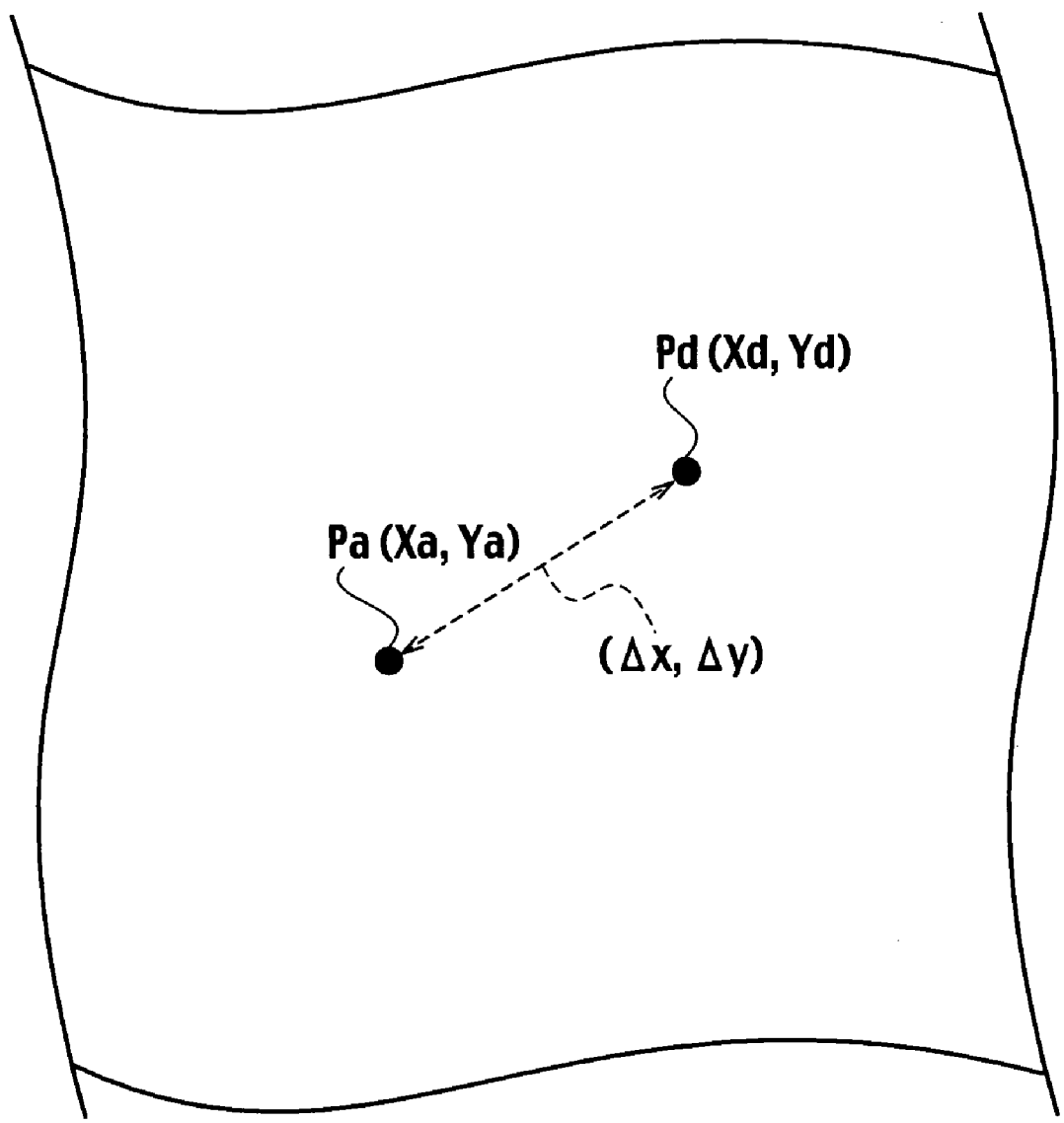
FIG. 3 is a schematic view for explaining an error between a target position and an actual illumination position of an electron beam according to the embodiment of the present invention.

When the electron beam is deflected, as shown in FIG. 3, deflecting distortion caused by the deflector, such as shifting, magnification, or high-order distortion may cause deviation of an actual illumination position Pa (Xa, Ya) of the electron beam from a desired illumination position (referred to as "target position" hereinafter) Pd (Xd, Yd) that was initially scheduled during a design stage. An error ($\Delta x$, $\Delta y$) between the actual illumination position Pa (Xa, Ya) and the target position Pd (Xd, Yd) is generally corrected by using the following tertiary polynomials:

$$Xc = Xd + a_0 + a_1 Xd + a_2 Yd + a_3 XdYd + a_4 Xd^2 + a_5 Yd^2 + a_6 Xd^2 Yd + a_7 XdYd^2 + a_8 Xd^3 + a_9 Yd^3 \quad (1)$$

$$Yc = Yd + b_0 + b_1 Xd + b_2 Yd + b_3 XdYd + b_4 Xd^2 + b_5 Yd^2 + b_6 Xd^2 Yd + b_7 Xdy^2 + b_8 Xd^3 + b_9 Yd^3 \quad (2)$$

In this case, (Xc, Yc) indicates a correction amount equivalent to a deflection voltage, and $a_0$ to $a_9$, and $b_0$ to $b_9$ indicate correction parameters. When an electron beam is deflected, right-side terms Xd, Yd of the correction equations (1) and (2) are replaced with coordinates (Xd, Yd) of the target position Pd (Xd, Yd), and a correction amount (Xc, Yc) is calculated by using the preset correction parameters $a_0$ to $a_9$, and $b_0$ to $b_9$. For easier explanation, it is presumed that the error ($\Delta x$, $\Delta y$) between the actual illumination position Pa (Xa, Ya) and the target position Pd (Xd, Yd) is corrected by using, e.g., the following correction equations (3) and (4):

$$Xc = a_0 + a_1 Xd + a_2 Yd + a_3 XdYd \quad (3)$$

$$Yc = b_0 + b_1 Xd + b_2 Yd + b_3 XdYd \quad (4)$$

In this case, (Xc, Yc) indicates a correction amount equivalent to a deflection voltage, and $a_0$ to $a_3$, and $b_0$ to $b_3$ indicates correction parameters. The correction parameters $a_0$ to $a_3$, and $b_0$ to $b_3$ take values to correct a magnification, rotation or the like. When the electron beams are deflected, right-side terms Xd, Yd of the correction equations (3) and (4) are replaced with coordinates (Xd, Yd) of the target position Pd (Xd, Yd) and a correction amount (Xc, Yc) is calculated by using the preset correction parameters $a_0$ to $a_3$, and $b_0$ to $b_3$. A deflection amplifier 30 applies a deflection voltage equivalent to the correction amount (Xc, Yc) to a deflector 22a to correct the illumination position of the electron beams. In this case, when values of the preset correction parameters $a_0$ to $a_3$, and $b_0$ to $b_3$ are inaccurate, a proper correction amount (Xc, Yc) cannot be determined, resulting in deterioration of drawing accuracy. Thus, it is important to obtain the proper correction parameters $a_0$ to $a_3$, and $b_0$ to $b_3$.

The correction tool 3 shown in FIG. 1 includes a central processing unit (CPU) 4, a correction parameter memory 51, a position memory 52, a main memory 6, an input unit 7, and an output unit 8.

The correction parameter memory 51 stores a plurality of initial correction parameters Pn−i to Pn that have been used for prior lithography condition correction, from initial correction parameters Pn ($a_{0n}$, $a_{1n}$, $a_{2n}$, $a_{3n}$, $b_{0n}$, $b_{1n}$, $b_{2n}$, and $b_{3n}$) used for the n-th correction of the lithography conditions, to initial correction parameters Pn−I ($a_{0n-i}$, $a_{2n-i}$, $a_{3n-i}$, $b_{0n-i}$, $b_{1n-i}$, and $b_{3n-i}$) used for the (n−i)-th correction of the lithography conditions (n, i are positive integers).

The position memory 52 stores a target position Pd (Xd, Yd) of the stage 26, and an actual illumination position Pa (Xa, Ya). The target position Pd (Xd, Yd) may be input via the input unit 7, or prestored in the position memory 52.

The CPU 4 includes a lithography circuit control unit 41, an error calculation section 42, a temporary correction unit 43, and a main correction unit 44. The lithography circuit control unit 41 controls a stage controller 33, a beam controller 31, and a signal processor 32 of the lithography circuit 2. The lithography circuit control unit 41 sets the initial correction parameters Pn, used for the n-th correction of the lithography conditions, and read from the correction parameter memory 51 in the beam controller 31. Further, the lithography circuit control unit 41 sets an electron beam correction interval in the beam controller 31 based on performance of the lithography tool 1.

The error calculation section 42 uses the target position Pd (Xd, Yd), read from the position memory 52, and the initial correction parameters Pn to calculate an error ($\Delta x$, $\Delta y$) from an actual illumination position Pa (Xa, Ya) when the electron beams are applied to the target position Pd (Xd, Yd).

The temporary correction unit 43 reads the error ($\Delta x$, $\Delta y$) calculated by the error calculation section 42, and uses a least squares method to calculate temporary correction parameters P'n ($a'_{0n}$, $a'_{1n}$, $a'_{2n}$, $a'_{3n}$, $b'_{0n}$, $b'_{1n}$, $b'_{2n}$, and $b'_{3n}$) which minimize the error ($\Delta x$, $\Delta y$)

The main correction unit 44 executes statistical processing (smoothing processing) by using the temporary correction parameters P'n calculated by the temporary correction unit 43 and the initial correction parameters Pn−i to Pn read from the correction parameter memory 51, and calculates main correction parameters Pn+1 ($a_{0n+1}$, $a_{1n+1}$, $a_{2n+1}$, $a_{3n+1}$, $b_{0n+1}$, $b_{1n+1}$, $b_{2n+1}$, and $b_{3n+1}$) For example, the main correction unit 44 calculates a weighted average obtained from the following equation (5) by substituting the correction parameters Pn−4 to Pn used for the n-th to (n−4)-th beam corrections and the temporary correction parameters P'n as a main correction parameter Pn+1.

$$Pn+1=(1-\Sigma mi)P'n+\Sigma(miPi) \quad (5)$$

In this case, mi indicates a weighting factor. A value of the weighting factor mi can be optionally decided via, e.g., the input unit 7. To execute a desired drawing, the lithography circuit control unit 41 sets the main correction parameter Pn+1 in the beam controller 31 of the lithography circuit 2.

The lithography circuit 2 shown in FIG. 1 includes a beam controller 31, a signal processor 32, a stage controller 33, and a deflection amplifier 30. The beam controller 31 substitutes the target position Pd (Xd, Yd) set by the lithography circuit control unit 41 of the correction tool 3, the correction parameters Pn ($a_{0n}$, $a_{1n}$, $a_{2n}$, $a_{3n}$, $b_{0n}$, $b_{1n}$, $b_{2n}$, and $b_{3n}$) used for the n-th correction of the lithography conditions, and the main correction parameter Pn+1 into the correction equations (3) and (4) to calculate a correction amount (Xc, Yc) for the target position Pd (Xd, Yd).

The deflection amplifier 30 applies a deflection voltage to the objective deflectors 22a and 22b shown in FIG. 2 using the correction amount (Xc, Yc) calculated by the beam controller 31, so that the objective deflectors 22a and 22b deflect the electron beam to the target position Pd (Xd, Yd). Note that the deflection amplifier 30 also applies a deflection voltage to the blanking deflectors 17a and 17b so that the blanking deflectors 17a and 17b turn on/off the electron beam. The deflection amplifier 30 applies a voltage to the CP selection deflectors 19a and 19b so that the CP selection deflectors 19a and 19b control the superposition of the electron beam.

A motor and a laser interferometer (not shown) are individually connected to the stage controller 33. The stage controller 33 controls the position of the stage 26 by driving the motor, based on the position of the coordinates of the stage 26 as measured by the laser interferometer.

The signal processor 32 converts the back-scattered electrons or secondary electrons detected by the detector 24 to an electrical signal, and transmits the actual illumination position Pa (Xa, Ya) to the correction tool 3. The actual illumination position Pa (Xa, Ya) is stored in the position memory 52.

The system shown in FIG. 1 further includes an input/output manager (interface) (not shown) for connecting the input unit 7, the output unit 8 and so on to the CPU 4.

The CPU 4 further includes a memory manager (not shown). The memory manager controls the correction parameters memory 51, the position memory 52, and the main memory 6 for reading and writing.

The main memory 6 includes read-only memory (ROM) and random-access memory (RAM). The ROM stores a program executed by the CPU 4 (the details of the program are described later). The RAM serves as a temporary data memory for storing data used in executing a program by the CPU 4, and used as a working domain. As the main memory 6, a flexible disk, a CD-ROM, a MO disk, etc. can be used.

The input unit 7 inputs the position for detecting and the like. The input unit 7 may be, for example, a keyboard, a mouse, a recognition device such as an optical character readers (OCR), a drawing input device such as an image scanner, or a special input unit such as a voice input device.

The output unit 8 can display the main parameters determined by the CPU 4 on a monitor, and can print out the main parameters. The output unit 8 may be a display device such as a liquid crystal display (LCD), CRT display, or a printing device such as an ink jet printer or a laser printer.

Next, an electron beam drawing method according to the embodiment of the present invention will be described, referring to the flow chart of FIG. 4.

In step S1, the lithography circuit control unit 41 shown in FIG. 1 sets the initial correction parameter Pn used for the previous (n-th) correction of the lithography conditions and read from the correction parameter memory 51 in the beam controller 31 of the lithography circuit 2.

In step S2, the lithography circuit control unit 41 also sets an electron beam correction interval in the beam controller 31, based on the performance or the like of the lithography tool 1.

In step S3, the beam controller 31 substitutes the target position Pd (Xd, Yd) read from the position memory 52 and the initial correction parameter Pn used for the previous (n-th) correction of the lithography conditions into the correction equations (3) and (4), so as to calculate a correction amount (Xc, Yc). The deflection amplifier 30 applies a deflection voltage equivalent to the correction amount (Xc, Yc), calculated by the beam controller 31, to the object deflectors 22a and 22b to correct the lithography conditions. The electron beams are deflected to the target position Pd (Xd, Yd), based on the corrected lithography conditions. Secondary electrons or reflected electrons are detected by the detector 24, and the actual illumination position Pa (Xa, Ya) of the electron beams is stored in the position memory 52.

In step S41, the error calculation section 42 calculates an error ($\Delta x$, $\Delta y$) between the actual illumination position Pa (Xa, Ya), read from the position memory 52, and the target position Pd (Xd, Yd), read from the position memory 52.

In step S42, the temporary correction unit 43 reads the error ($\Delta x$, $\Delta y$) calculated by the error calculation section 42, and calculates a temporary correction parameter P'n to minimize the error ($\Delta x$, $\Delta y$) by using a least squares method.

In step S43, the main correction unit 44 carries out statistical processing (smoothing processing) of the temporary correction parameter P'n calculated by the temporary correction unit 43 and the plurality of initial correction parameters Pn−i to Pn, read from the correction parameter memory 51, to calculate a main correction parameter Pn+1.

In step S5, the lithography circuit control unit 41 sets the main correction parameter Pn+1 calculated by the main correction unit 44 in the beam controller 31.

In step S6, the beam controller 31 calculates a correction amount (Xc, Yc) for a desired drawing position (target position) Pd (Xd, Yd) by using the main correction parameter Pn+1. The deflection amplifier 30 applies a deflection voltage equivalent to the correction amount (Xc, Yc) to correct the lithography conditions of the electron beams. Under the corrected lithography conditions, desired drawing process is carried out by using the electron beams.

In step S7, the process proceeds to step S8 if the time is within a time for the correction of the lithography conditions set in the step S2. On the other hand, in the step S7, if the correction time of the lithography conditions has passed (expired), the drawing process is temporarily stopped to return to the step S3.

In the step S8, if the drawing process has finished, end processing is executed. In the step S8, if the drawing process has not been finished, the process returns to the step S6 to continue the drawing process.

Figure 4:
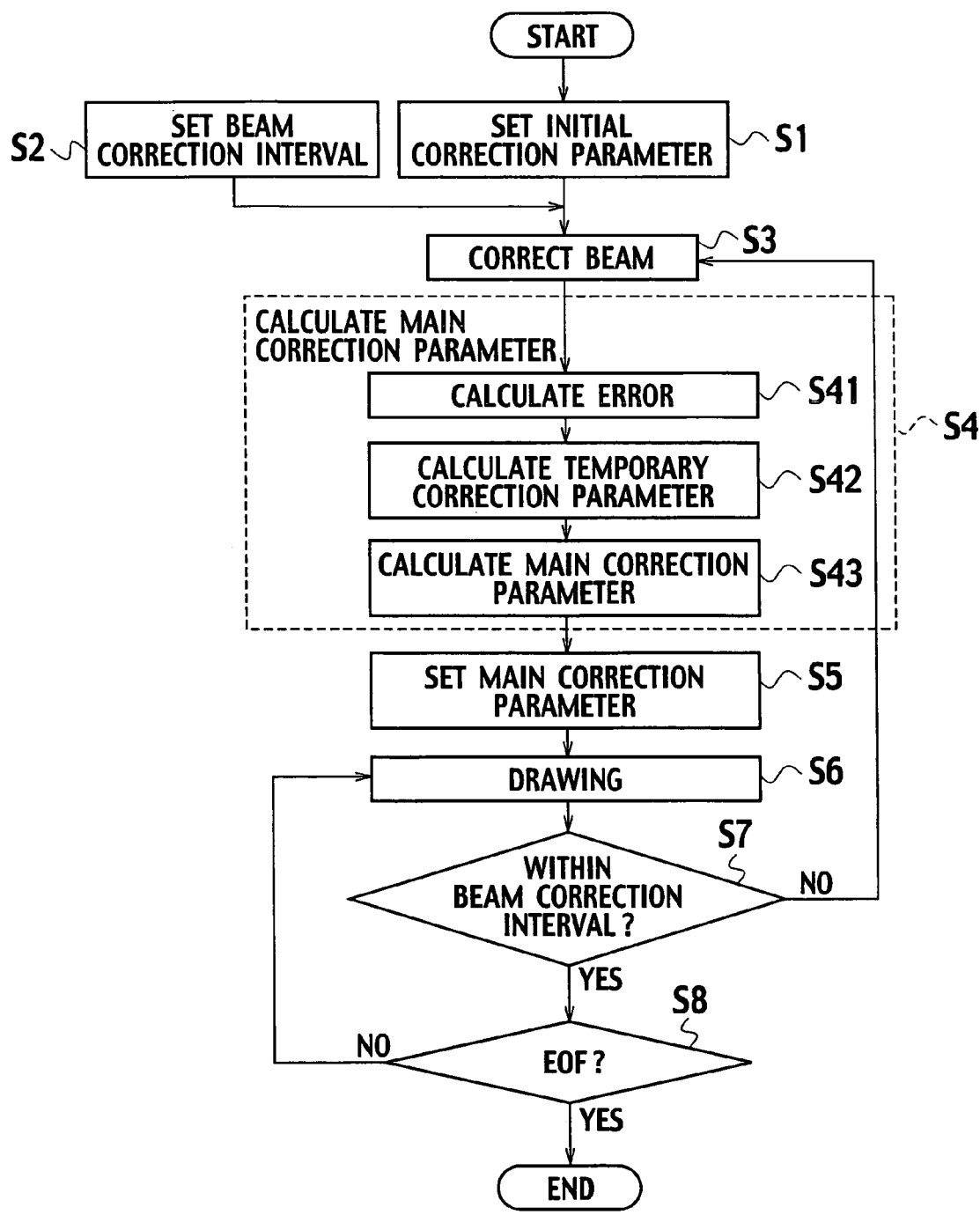
FIG. 4 is a flow chart for explaining an example of a method for drawing with an electron beam according to the embodiment of the present invention.

In the case of correcting the electron beams by using the temporary correction parameters P'n calculated in the step S42 of FIG. 4, the initial correction parameter Pn used for the previous or prior (n-th) correction of the lithography conditions and the error ($\Delta x$, $\Delta y$) may be influenced by external disturbances to cause the temporary correction parameter P'n to deviate from an optimal value.

On the other hand, according to the embodiment of the present invention, in the step S43, the statistical processing is carried out by the temporary correction parameter P'n and the initial correction parameters Pn−i to Pn used for the previous correction of the lithography conditions. Thus, the main correction parameter Pn+1, with a reduced influence of external disturbances, can be calculated to improve drawing accuracy.

Figure 5:
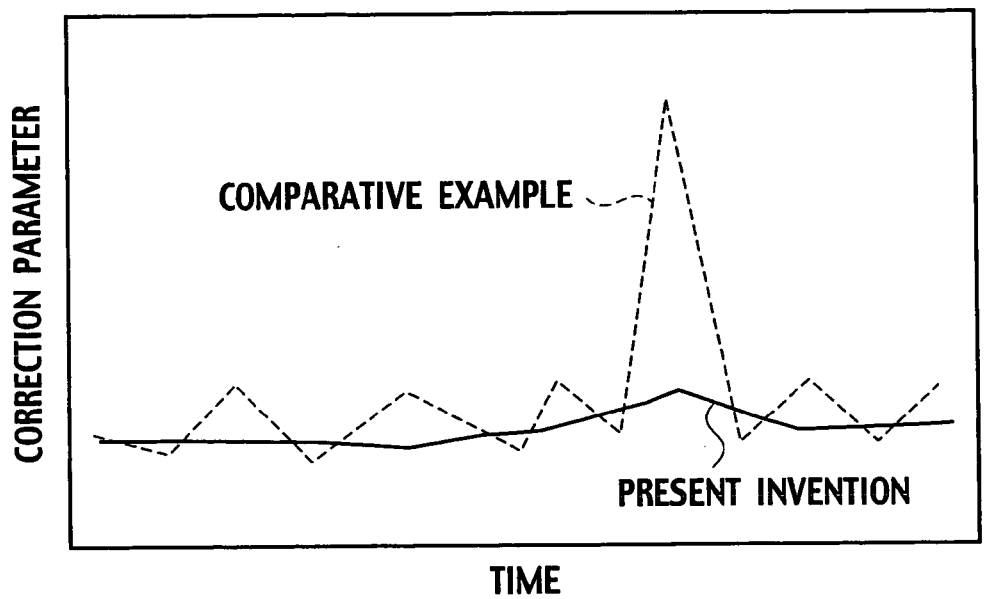
FIG. 5 is a graph showing a fluctuation of a correction parameter according to the embodiment of the present invention, and a fluctuation of a correction parameter according to a comparative example.

FIG. 5 shows the history of the main correction parameter Pn+1 by a solid line when the lithography conditions are corrected by using the main correction parameter Pn+1 of the embodiment of the present invention, and the history of the temporary correction parameter P'n by a dotted line when the lithography conditions are corrected by using the temporary correction parameter P'n before the main correction parameter Pn+1 is calculated, as a comparative example. It can be understood that a correction variance is smaller in the history of the main correction parameter Pn+1 than that in the history of the temporary correction parameter P'n.

Figure 6:
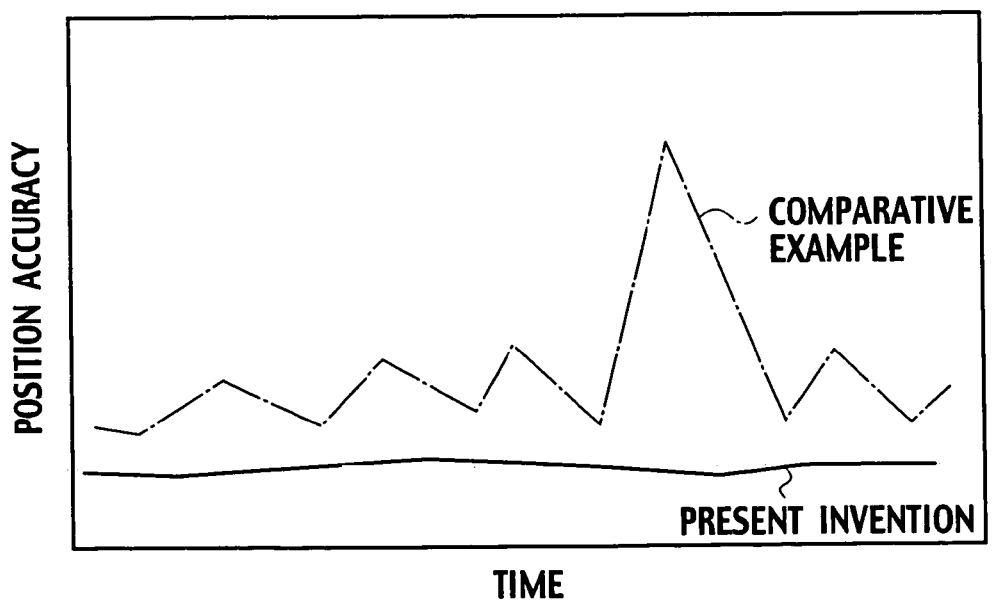
FIG. 6 is a graph showing a fluctuation of position accuracy according to the embodiment of the present invention, and a fluctuation of position accuracy according to a comparative example.

FIG. 6 shows the history of the drawing accuracy by a solid line when the lithography conditions of the electron beams are corrected by using the main correction parameter Pbn+1 of the embodiment of the present invention, and the history of the drawing accuracy by a dotted line when the lithography conditions of the electron beams are corrected by using the temporary correction parameters P'n, as a comparative example. It can be understood that deterioration of the drawing accuracy is suppressed more in the case of using the main correction parameter Pn+1, indicated by the solid line, than in the case of using the temporary correction parameter P'n, indicated by the dotted line.

Figure 7:
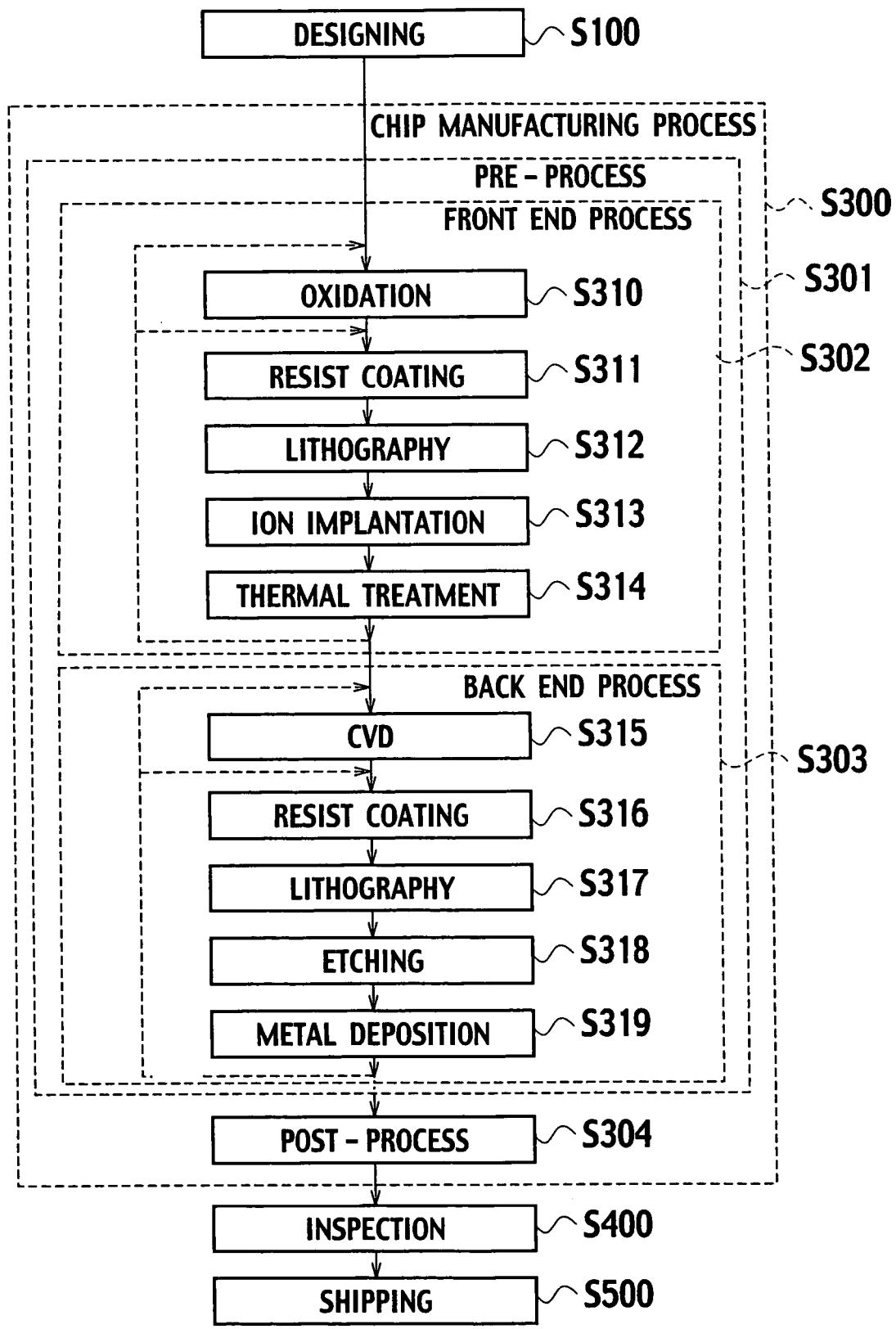
FIG. 7 is a flow chart for explaining an example of a method for manufacturing a semiconductor device according to the embodiment of the present invention.

Next, an example of a method for manufacturing a semiconductor device (LSI) by directly writing, using the electron beam drawing device shown in FIG. 1, will be explained with reference to FIG. 7.

In Step S100, process mask simulation is carried out. Device simulation is performed by a result of the process mask simulation and each value of currents and voltages to be input to each of the electrodes is set. Circuit simulation of the LSI is performed based on electrical properties obtained by the device simulation. Accordingly, layout data (design data) of device patterns is generated. The layout data is converted to lithography data for an electron beam drawing device.

Next, a series of processes including an oxidation process in Step S310, a resist coating process in Step S311, the photolithography process with directly writing in Step S312, an ion implantation process in Step S313, a thermal treatment process in Step S314, and the like are repeatedly performed in a front-end process (substrate process) in Step 302. In step S313, a resist film (a photo resist film) is spin-coated on a semiconductor wafer. In step S312, by using the electron beam drawing device shown in FIG. 1, the following procedures, which are similar to steps S1 to S8 shown in FIG. 4, are executed: calculating the main correction parameters Pn+1; calculating the correction amount (Xc, Yc) using the main correction parameters Pn+1; and correcting lithography conditions using the correction amount (Xc, Yc). By using the corrected lithography conditions, the semiconductor patterns are delineated to the photoresist film on the semiconductor wafer by directly writing. The photoresist film is developed, and etching masks made of resist film, are delineated. In step S313, the semiconductor wafer is processed using the etching masks delineated in step S312. When the above-described series of processes are completed, the procedure advances to Step S303.

Next, a back-end process (surface wiring process) for wiring the substrate surface is performed in Step S303. A series of processes including a chemical vapor deposition (CVD) process in Step S315, a resist coating process in Step S316, the photolithography process with directly writing in Step S317, an etching process in Step 318, a metal deposition process in Step 319, and the like are repeatedly performed in the back-end process. Step S317 is the same as the step S312. That is, the step is the same as the procedures of steps S1 to S8 shown in FIG. 4, lithography conditions are corrected, and the semiconductor patterns are delineated on the photoresist film on the semiconductor wafer by using the electron beam drawing device shown in FIG. 1 to directly write thereon. The photoresist film is developed, and etching masks made of resist film are delineated. When the above-described series of processes are completed, the procedure advances to Step S304.

When a multilayer wiring structure is competed and the pre-process is finished, the substrate is diced into chips of a given size by a dicing machine such as a diamond blade in Step S304. The chip is then mounted on a packaging material made of metal, ceramic or the like. After electrode pads on the chip and leads on a leadframe are connected to one another, a desired package assembly process, such as plastic molding, is performed.

In Step S400, the semiconductor device is completed after an inspection of properties relating to performance and function of the semiconductor device, and other given inspections on lead shapes, dimensional conditions, a reliability test, and the like. In Step S500, the semiconductor device which has cleared the above-described processes is packaged to be protected against moisture, static electricity and the like, and is then shipped out.

According to a method for manufacturing a semiconductor device by directly writing, in steps S312 and S317, the correction amount (Xc, Yc) is calculated using the main correction parameters Pn+1, and lithography conditions are corrected using the correction amount (Xc, Yc). Therefore it is possible to improve drawing accuracy, and to improve manufacturing yield of a semiconductor device.

(First Modification)

Figure 8:
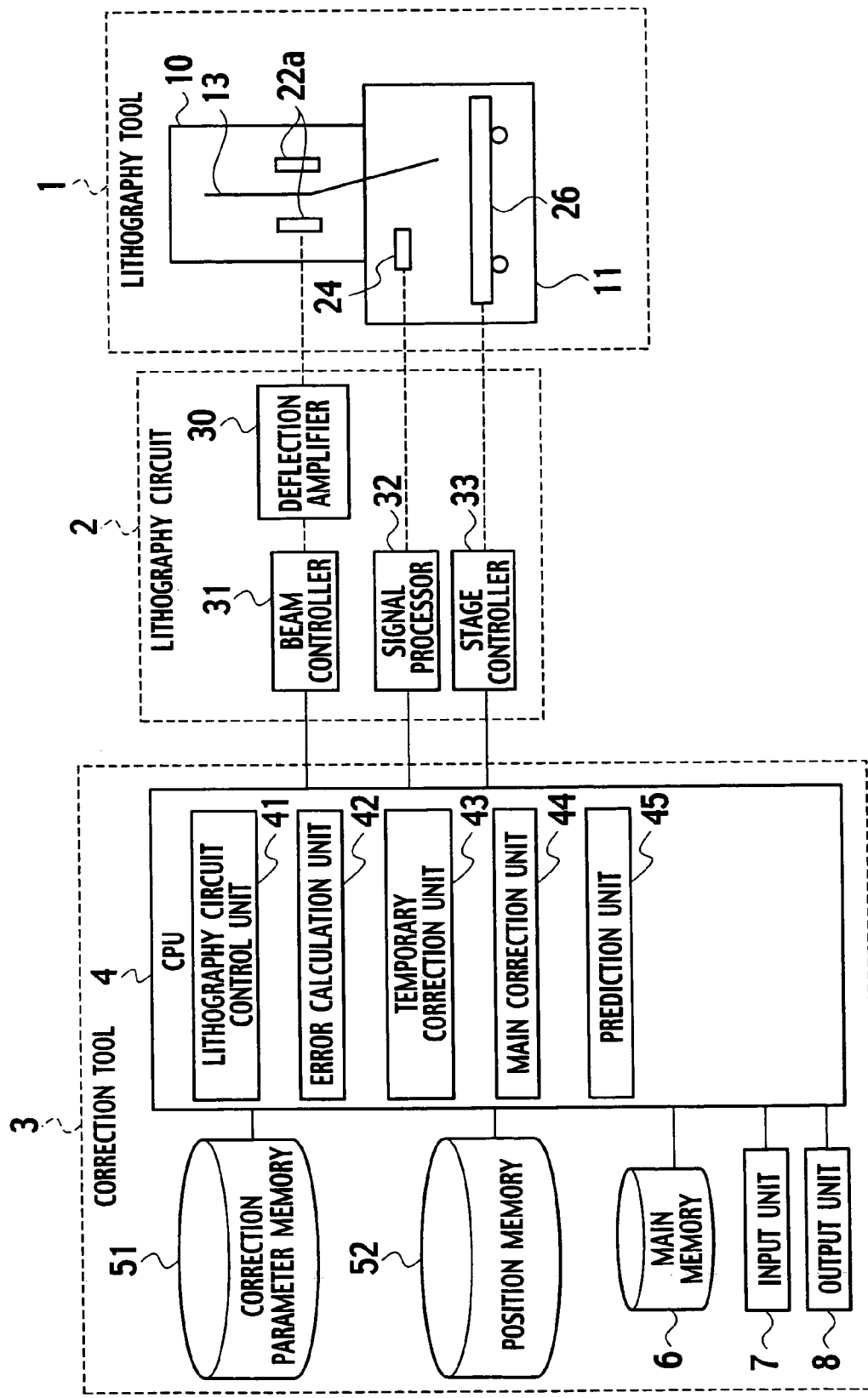
FIG. 8 is a schematic view showing an example of an electron beam drawing device according to a first modification of the embodiment of the present invention.

According to a first modified example of the embodiment of the present invention, as shown in FIG. 8, a correction tool 3 of an electron beam drawing device includes a prediction unit 45, associated with a CPU 4. The prediction unit 45 uses time sequentially analysis to analyze a plurality of initial correction parameters Pn−i to Pn, used up to the n-th correction of lithography conditions and read from a correction parameter memory 51, to obtain a trend of changers of the initial correction parameters Pn−i to Pn. Further, the prediction unit 45 predicts an (n+1)-th main correction parameter Pn+1 based on the trend of the changes of the initial correction parameters Pn−i to Pn.

Figure 9:
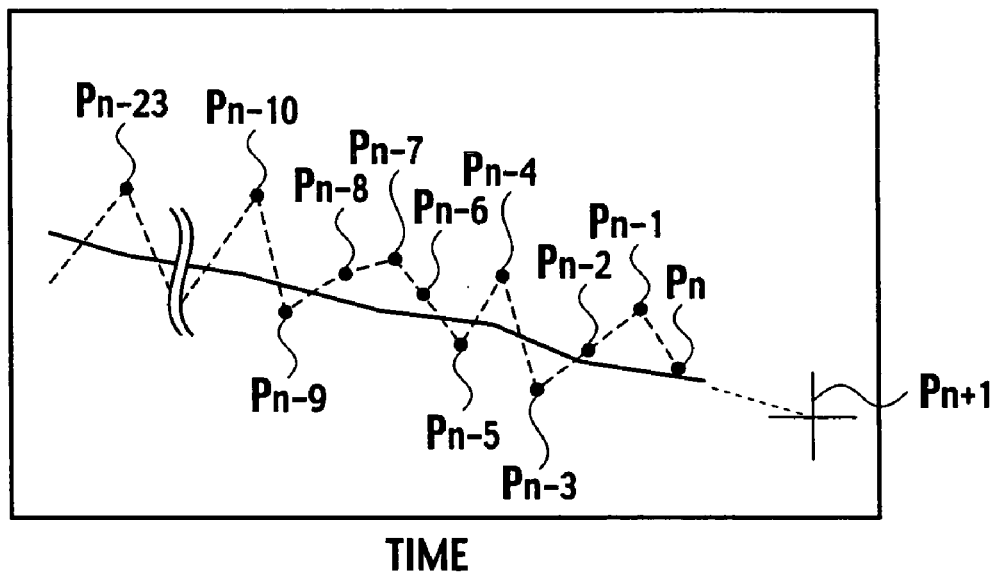
FIG. 9 is a graph for explaining the prediction of a correction parameter according to the first modification of the embodiment of the present invention.

For example, the prediction unit 45 reads twenty-four correction parameters Pn−23 to Pn calculated for every hour within the past twenty-four hours, as indicated by a dotted line in FIG. 9. The prediction unit 45 time-sequentially analyzes the correction parameters Pn−23 to Pn to obtain a trend of changes of the initial correction parameters Pn−i to Pn, with respect to a time axis, as a moving average for every three hours as indicated by a solid line in FIG. 9. The prediction unit 45 predicts a main correction parameter Pn+1, indicated by a cross, from the trend of the changes of the correction parameters Pn−23 to Pn, indicated by the solid line.

The other configurations are substantially the same as the electron beam drawing device shown in FIG. 1, and a redundant description is omitted.

Next, a method for drawing with an electron beam according to the first modification of the embodiment of the present invention will be described, referring to FIG. 10.

The procedures of steps S1 and S2 are substantially the same as above, and a redundant description is omitted. In step S2x, the lithography circuit control unit 41 sets a beam prediction interval for predicting the main correction parameters Pn+1. The procedures of steps S3 to S6 are substantially the same as the procedures shown in FIG. 4, and a redundant description is omitted.

In step S6x, if the time is within the beam prediction interval, the procedure will advance to step S7. On the other hand, if the beam prediction interval has elapsed, the drawing process is temporally stopped to advance to step S6y.

In step S6y, the prediction unit 45 time-sequentially analyzes initial correction parameters Pn−i to Pn, read from the correction parameters memory 51, to obtain a trend of changes of the initial correction parameters Pn−i to Pn with respect to a time axis. The prediction unit 45 predicts main correction parameters Pn+1, based on the trend of changes of the initial correction parameters Pn−i to Pn. Returning to step S5, the lithography circuit control unit 41 sets the predicted main correction parameters Pn+1 to the beam controller 31. In step S6, desired drawing process is carried out by a lithography tool 1. Here, the beam controller 31 calculates a correction amount (Xc,Yc) using the main correction parameters Pn+1. The deflection amplifier 30 applies a deflection voltage to the objective deflectors 22a and 22b using the correction amount (Xc, Yc) to correct the illumination position of the electron beam.

In step S7, if the time is within an electron beam correction interval, the procedure will advance to step S8. On the other hand, if the electron beam correction time has elapsed in step S7, the drawing process is temporally stopped to return to correction of lithography conditions of step S3. In step S8, if the drawing has been finished, end processing is executed. On the other hand, if the drawing process has not been finished, the process returns to the step S6 to continue the drawing process.

According to the first modified example of the embodiment of the present invention, as the prediction unit 45 predicts the main correction parameter Pn+1, and the lithography conditions are corrected by using the predicted main correction parameter Pn+1, correction time can be decreased more than when the electron beams are actually applied to calculate the main correction parameter Pn+1. As a result, the time for substantial operations is increased to improve productivity. Thus, it is possible to increase manufacturing yield of semiconductor devices.

Figure 11:
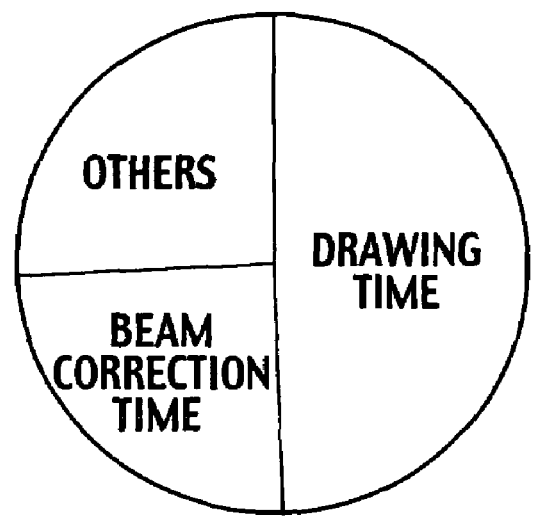
FIG. 11 is a graph showing a rate of operation of an electron beam drawing device according to the first modification of the embodiment of the present invention.
Figure 12:
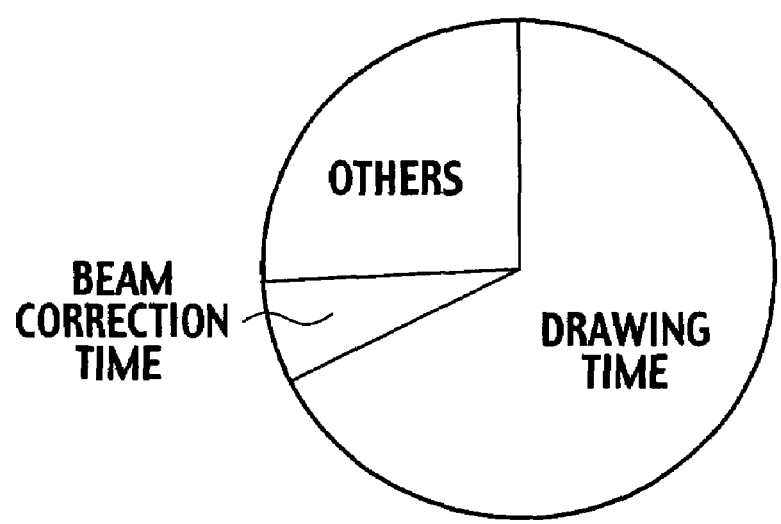
FIG. 12 is a graph showing a rate of operation of an electron beam drawing device according to a comparative example.

FIG. 11 shows a breakdown of operation time in the case of correcting the lithography conditions by using the temporary correction parameter P'n as a comparative example. It can be understood that as the lithography conditions are frequently corrected, the operation time is expended for correction of the lithography conditions, and drawing time, i.e., production time, is short. On the other hand, FIG. 12 shows a breakdown of operation time in the case of using the electron beam drawing device of FIG. 8. According to the first modified example, as the main correction parameter Pn+1 is predicted, the correction time of the exposure device is shorter as compared with that of FIG. 11. As a result, drawing time (production time) in the device operation time is increased.

Figure 13:
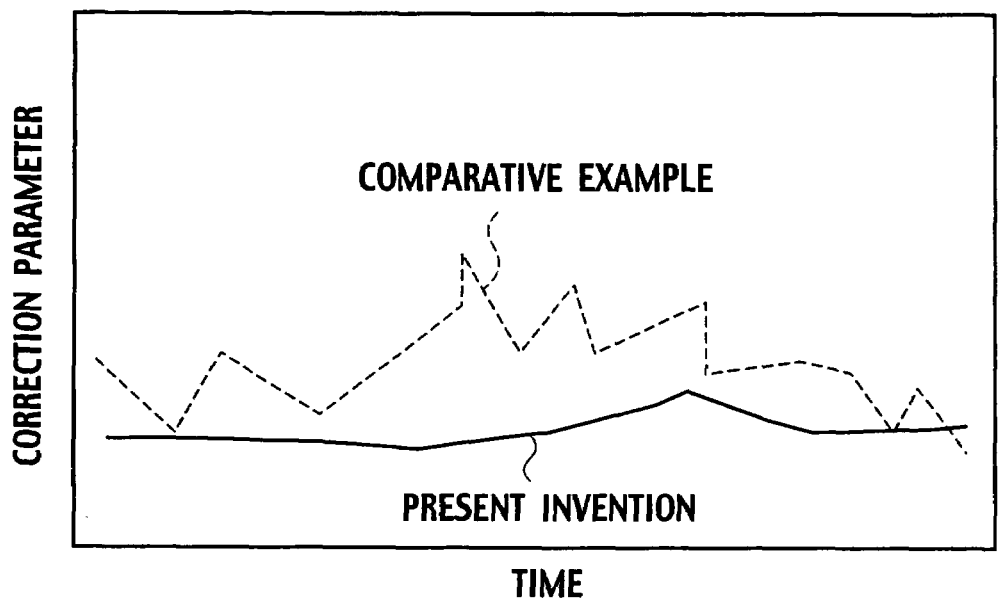
FIG. 13 is a graph showing a fluctuation of a correction parameter according to the first modification of the embodiment of the present invention, and a fluctuation of a correction parameter according to a comparative example.

FIG. 13 shows the history of the main correction parameter Pn+1 by a solid line when the lithography conditions are corrected by the main correction parameter Pn+1, and the history of the temporary correction parameter P'n by a dotted line when the lithography conditions are corrected by using the temporary correction parameters P'n, as a comparative example. It can be understood that the history of the main correction parameter Pn+1, indicated by the solid line, is stabler with a smaller fluctuation than the history of the temporary correction parameter P'n, indicated by the dotted line.

Figure 14:
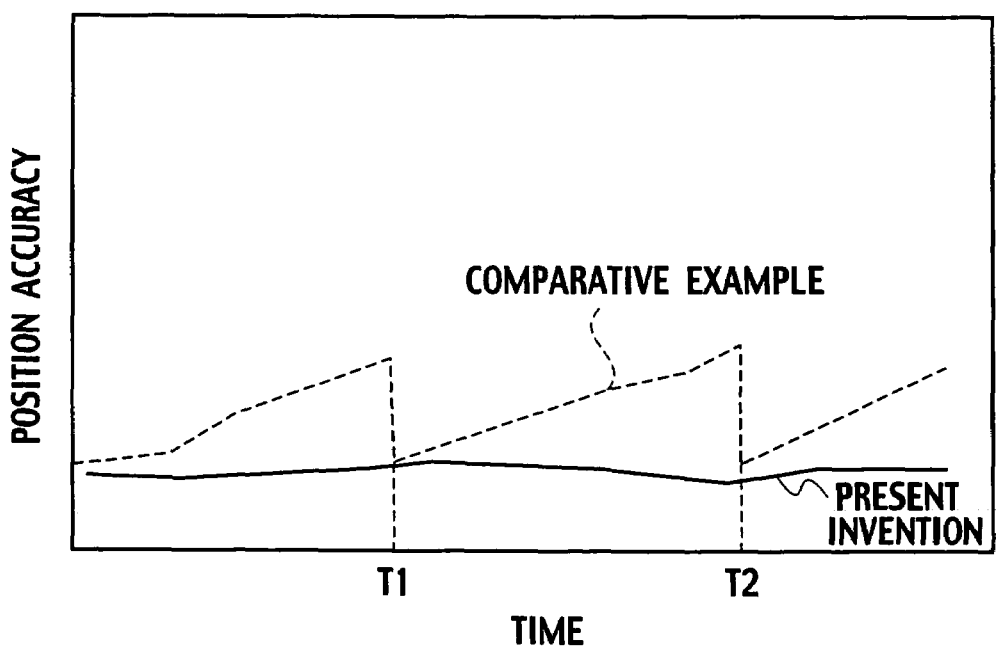
FIG. 14 is a graph showing a fluctuation of position accuracy according to the first modification of the embodiment of the present invention, and a fluctuation of position accuracy according to a comparative example.

FIG. 14 shows the history of the drawing accuracy, by a solid line, when the main correction parameter Pn+1 of the embodiment of the present invention is predicted to make corrections, and the history of the drawing accuracy, by a dotted line, when the temporary correction parameter Pn'n is used to make corrections, as a comparative example.

It can be understood that in the comparative example indicated by the dotted line, after a passage of time from time $T_{11}$ of correcting the lithography conditions, the drawing accuracy deteriorates until a net time $T_{12}$ of correcting the lithography conditions. On the other hand, in the case of the embodiment of the present invention indicated by the solid line, as the main correction parameter Pn+1 is predicted within electron beam correction intervals $T_{11}$ and $T_{12}$, and the lithography conditions are corrected by using the predicted main correction parameter Pn+1, stable drawing accuracy is achieved even within the electron beam correction intervals $T_{11}$ and $T_{12}$.

(Second Modification)

Figure 15:
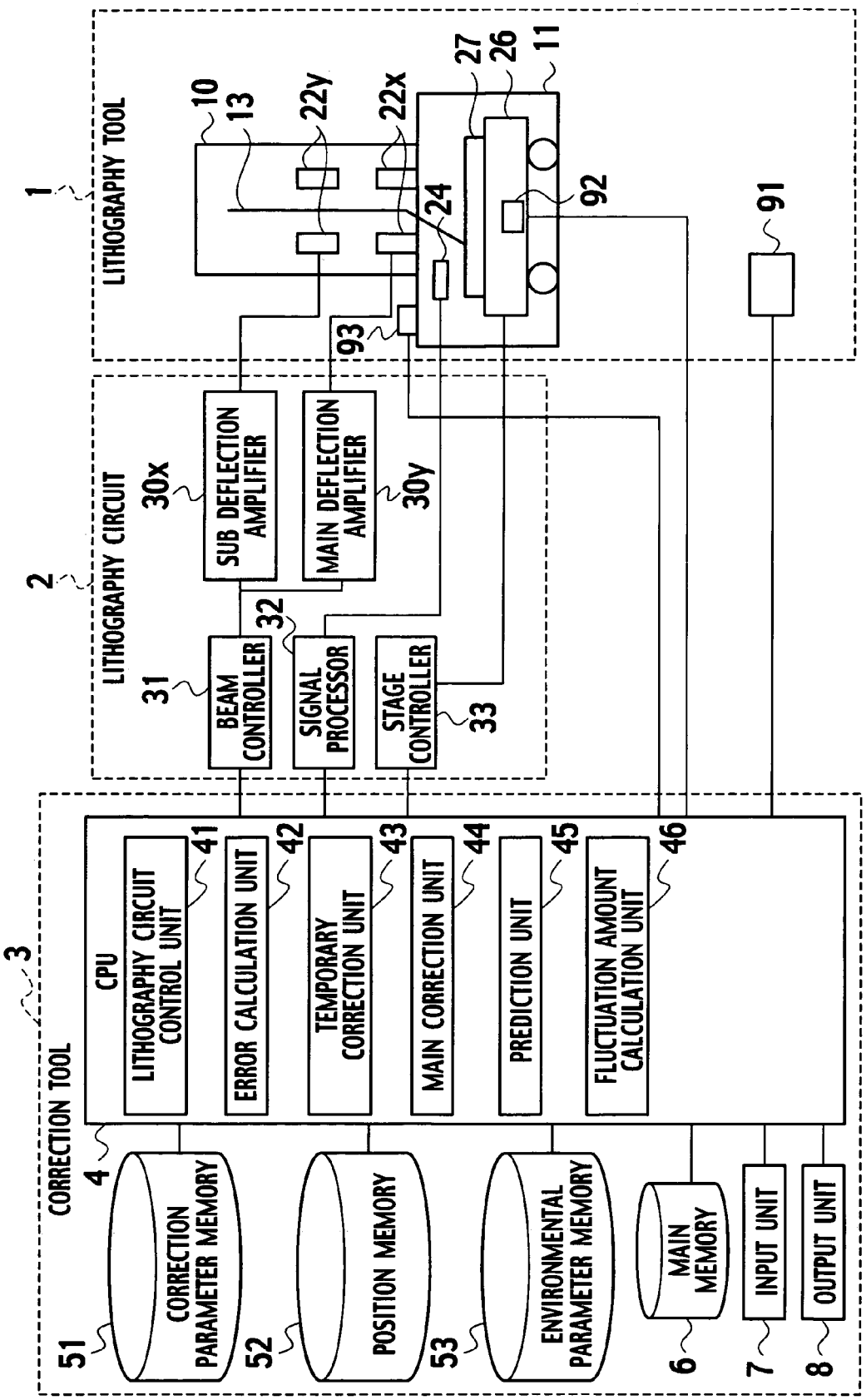
FIG. 15 is a schematic view showing an example of an electron beam drawing device according to a second modification of the embodiment of the present invention.

According to a second modified example of the embodiment of the present invention, as shown in FIG. 15, the electron beam drawing device is different from the electron beam drawing device shown in FIG. 1. A pressure sensor 91 for measuring pressure is provided in a clean room (CR) (referred to as "CR pressure" hereinafter). Also provided in the clean room is a lithography tool 1, a stage temperature sensor 92 for measuring a temperature of a stage 26 (referred to as "stage temperature" hereinafter), and a sample room temperature sensor 93 for measuring a temperature in a sample chamber 11 (referred to as "sample room temperature" hereinafter).

Figure 16:
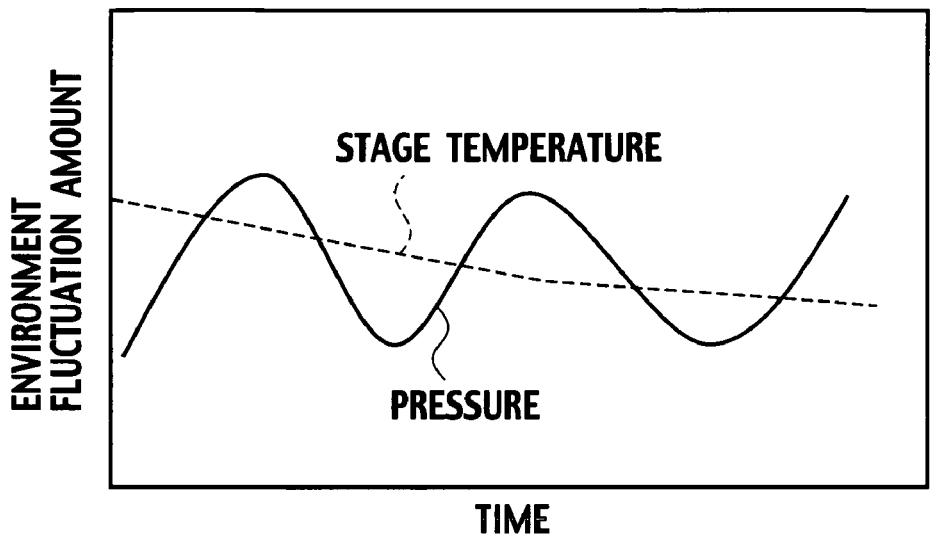
FIG. 16 is a graph showing a fluctuation of an environmental parameter according to the second modification of the embodiment of the present invention.

As shown in FIG. 16, the CR pressure and the stage temperature frequently fluctuate. When the CR pressure fluctuates, the sample chamber 11, which is a vacuum container (chamber), is deformed and causes an error in electron beam illumination position. When the stage temperature fluctuates, the stage 26 itself or a sample 27 arranged on the stage 26 is deformed and causes error of an electron beam illumination position. Additionally, the sample room temperature fluctuates to expand/contract a metal, causing an error of the electron beam illumination position. The CR pressure, the stage temperature, and the sample room temperature respectively measured by the pressure sensor 91, the stage temperature sensor 92, and the sample room temperature sensor 93 are stored as "environmental parameters" in an environmental parameter memory 53.

Another difference from the electron beam drawing device shown in FIG. 1 is that a CPU 4 shown in FIG. 15 includes a fluctuation amount calculation unit 46. A prediction unit 45 predicts a main correction parameter Pn+1 based on initial correction parameters Pn−i to Pn read from the correction parameter memory 51. The fluctuation amount calculation unit 46 calculates a difference between a current (n+1-th) environmental parameter read from the environmental parameter memory 53 and a previous (n-th) environmental parameter as an "environmental parameter fluctuation amount".

The prediction unit 45 calculates a main correction parameter fluctuation amount ΔP, based on environmental parameter fluctuation amounts $\Delta T_{stg}$, $\Delta P_{cr}$, and $\Delta T_{ch}$ by using a prediction equation (6) which weights the stage temperature fluctuation amount $\Delta T_{stg}$, the CR pressure fluctuation amount $\Delta P_{cr}$, and the sample room temperature fluctuation amount $\Delta T_{ch}$ by weighting factors C1 to C3 to linearly connect the respective fluctuation amounts.

$$\Delta P = C1\Delta T_{stg} + C2\Delta P_{cr} + C3\Delta T_{ch} \qquad (6)$$

In this case, values of the weighting factors C1 to C3 may be experimentally obtained, and stored in the environmental parameter memory 53 or the like, or input via an input unit 7. Further, the prediction unit 45 adds the main correction parameter fluctuation amount ΔP to the predicted main correction parameter Pn+1. As a result, the main correction parameter Pn+1+ΔP that takes the environmental parameter fluctuation amounts $\Delta T_{stg}$, $\Delta P_{cr}$, and $\Delta T_{ch}$ into consideration is predicted.

Next, a method for drawing with an electron beam according to the second modification of the embodiment of the present invention will be described, referring to FIGS. 10 and 17.

In the method for drawing with an electron beam according to the second modification of the embodiment of the present invention, the pressure sensor 91, the stage temperature sensor 92 and sample room temperature sensor 93 shown in FIG. 15 continuous monitor the environmental parameter fluctuations. The pressure sensor 91, the stage temperature sensor 92 and the sample room temperature sensor 93 detect CR pressure, stage temperature, sample room temperature and so on as environmental parameters, and stores the environmental parameters in the environmental parameter memory 53.

Figure 10:
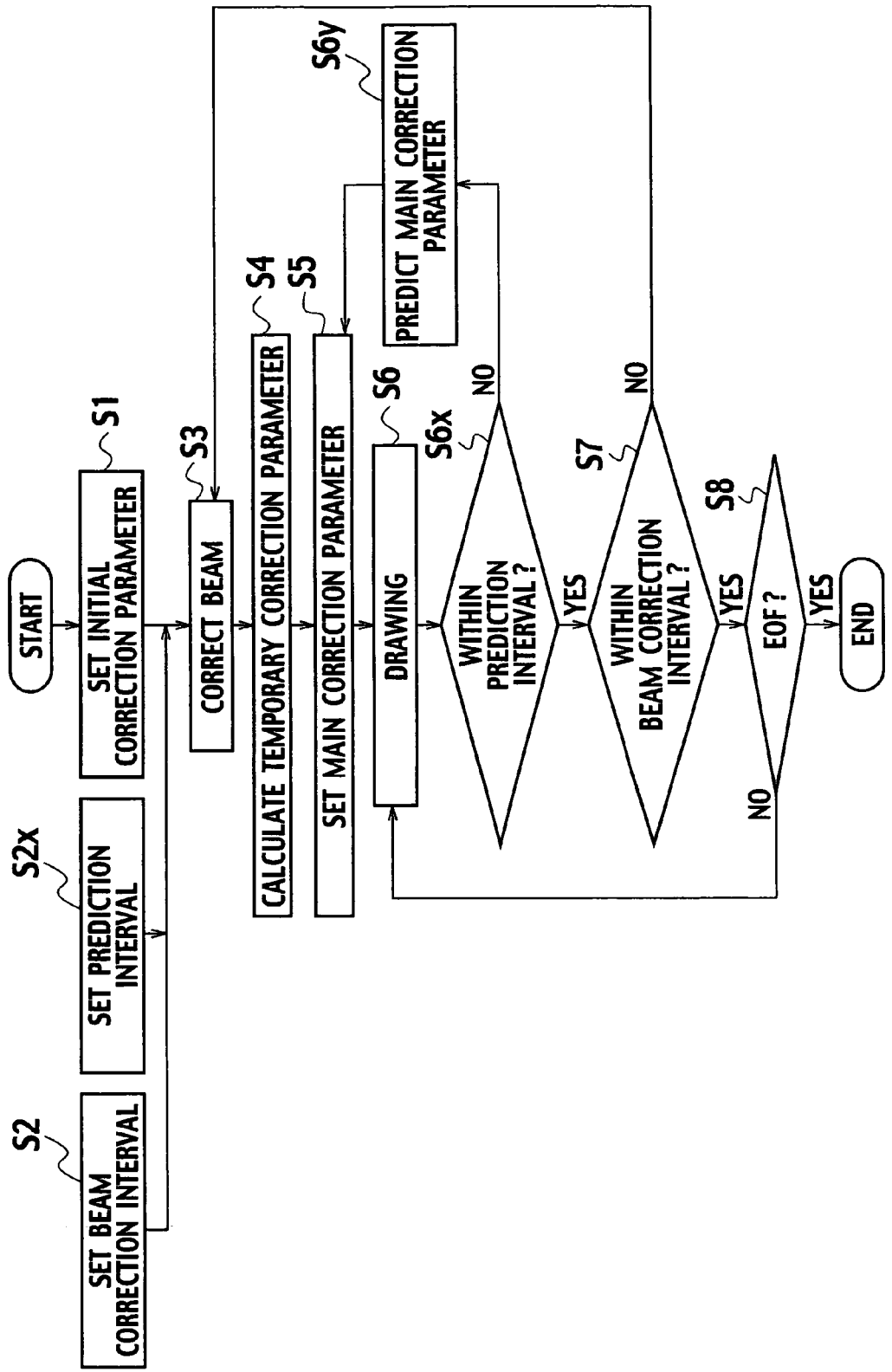
FIG. 10 is a flow chart for explaining an example of a method for drawing with an electron beam according to the first modification of the embodiment of the present invention.

The procedures of steps S1 to S6 shown in FIG. 10 are substantially the same as the, and a redundant description is omitted.

Figure 17:
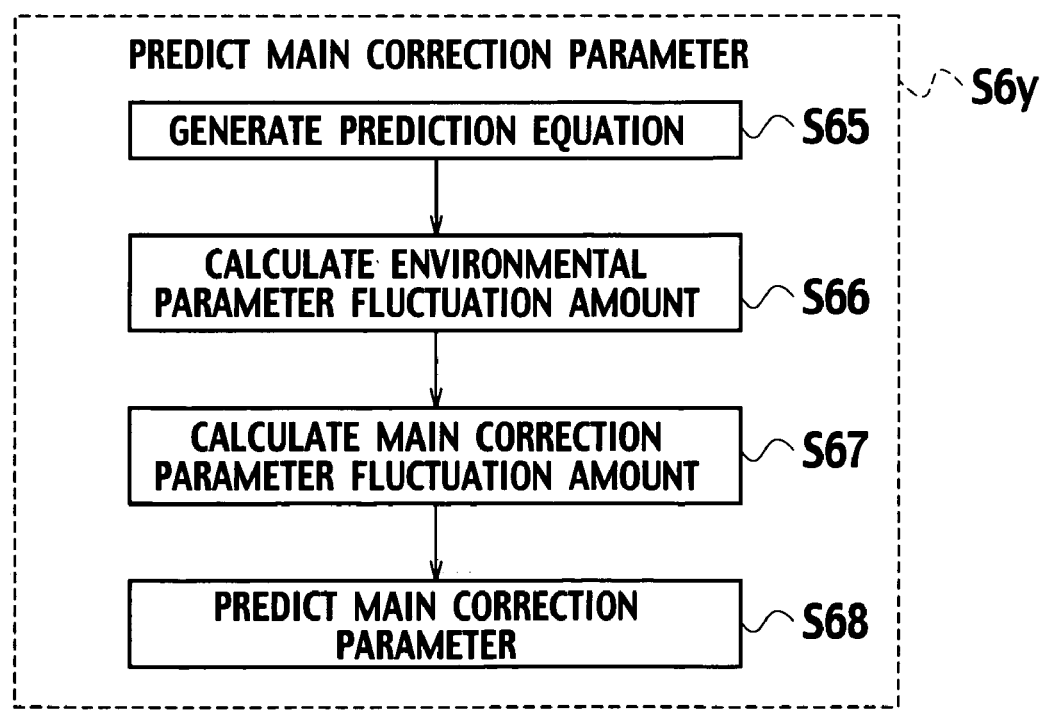
FIG. 17 is a flow chart for explaining an example of a method for drawing with an electron beam according to the second modification of the embodiment of the present invention.

In step S6y shown in FIG. 10, as shown in FIG. 17, the prediction unit 45 predicts the main correction parameters Pn+1 in step S61. In step S62, the fluctuation amount calculation unit 46 calculates a difference between current (n+1-th) environmental parameters and previous (n-th) environmental parameters read from the environmental parameter memory 53, and determines the stage temperature fluctuation amount $\Delta T_{stg}$, the CR pressure fluctuation amount $\Delta P_{cr}$ and the sample room temperature fluctuation amount $\Delta T_{ch}$.

In step S63, the prediction unit 45 substitutes the stage temperature fluctuation amount $\Delta T_{stg}$, the CR pressure fluctuation amount $\Delta P_{cr}$ and the sample room temperature fluctuation amount $\Delta T_{ch}$ in the prediction equation (6), and calculates a fluctuation amount ΔP of the main correction parameters.

In step S64, the prediction unit 45 adds fluctuation amount ΔP of the main correction parameters to the predicted main correction parameters Pn+1. As a result, the main correction parameters Pn+1+ΔP are predicted, which takes into consideration the environmental parameter fluctuation amounts $\Delta T_{stg}$, $\Delta P_{cr}$, $\Delta T_{ch}$.

The other configurations shown in FIG. 10 are substantially the same as the electron beam drawing method of the embodiment, and a redundant description is omitted.

Figure 18:
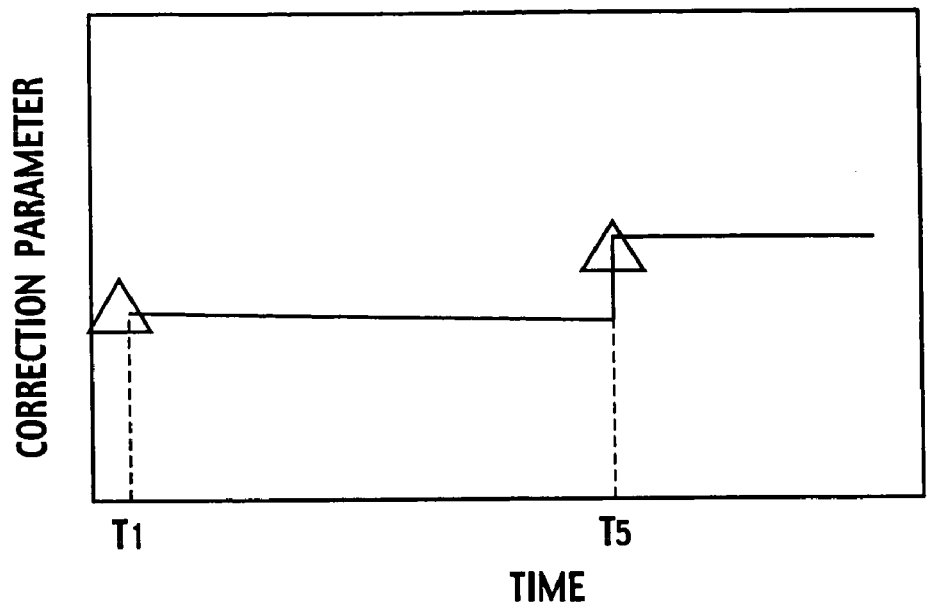
FIG. 18 is a graph showing a fluctuation of a correction parameter according to a comparative example.
Figure 19:
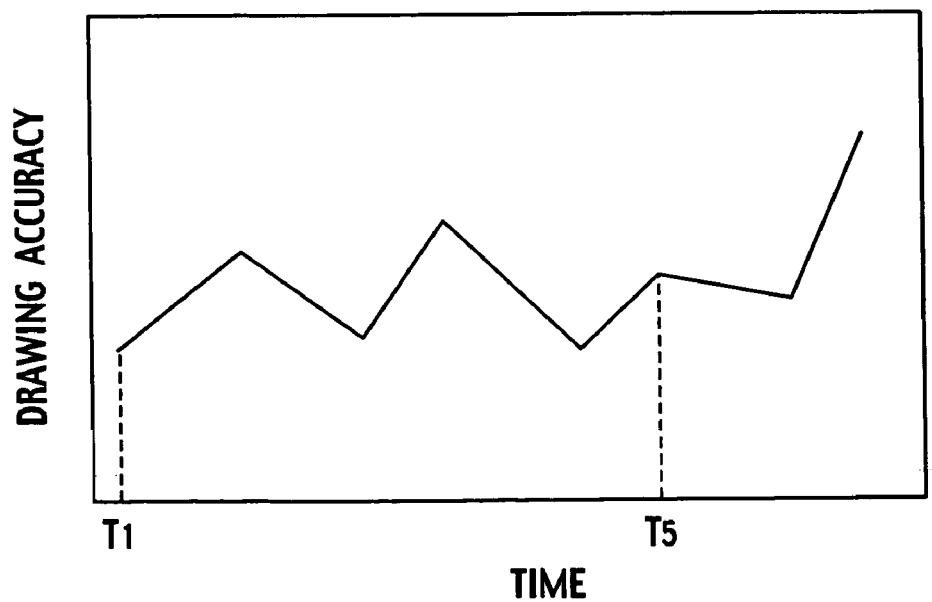
FIG. 19 is a graph showing a fluctuation of drawing accuracy according to a comparative example.
Figure 20:
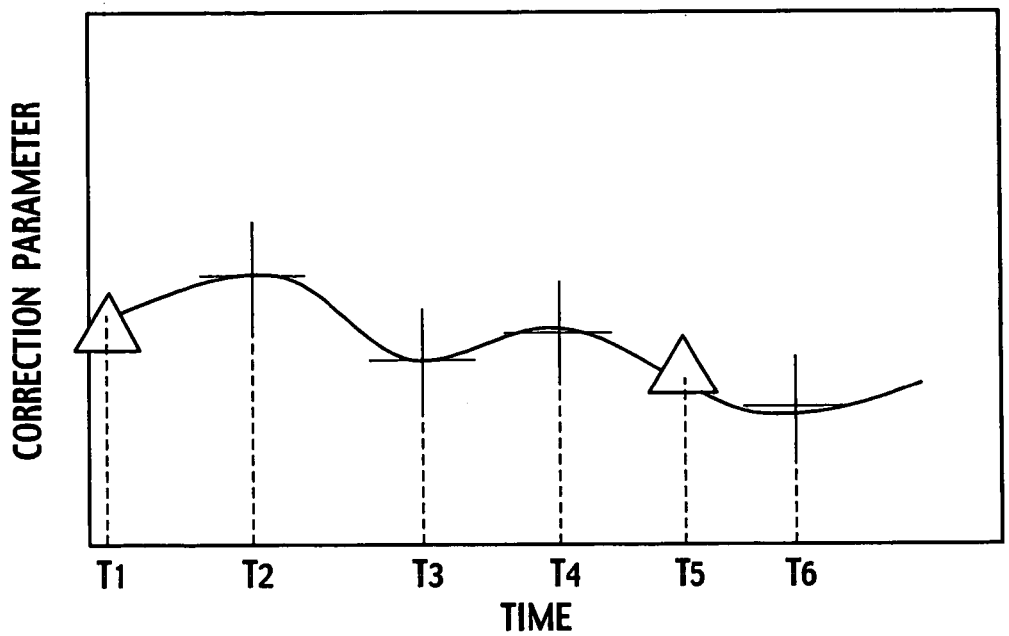
FIG. 20 is a graph showing a fluctuation of a correction parameter according to the second modification of the embodiment of the present invention.
Figure 21:
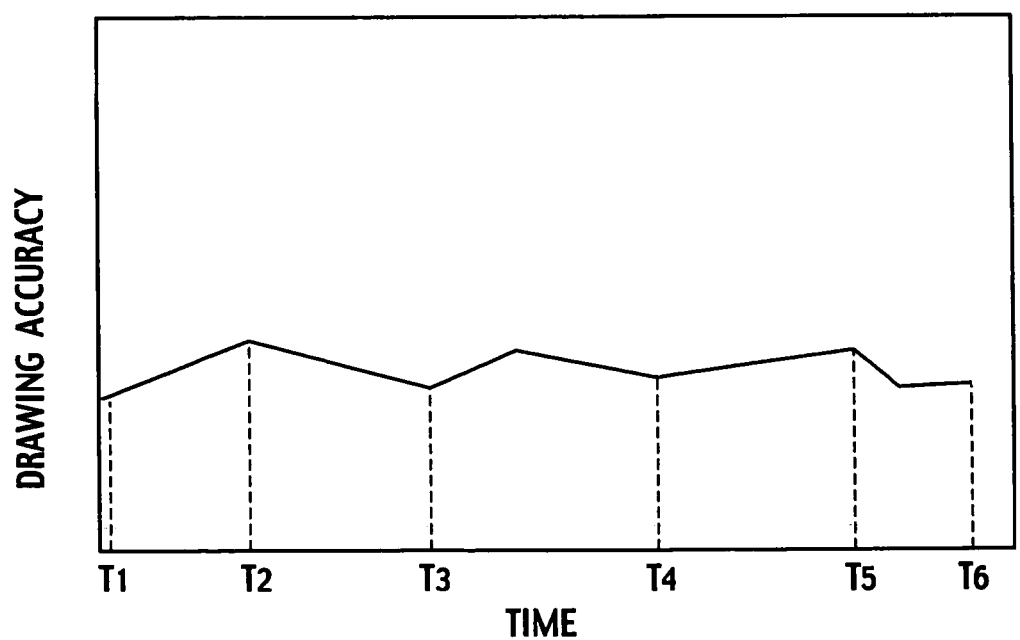
FIG. 21 is a graph showing a fluctuation of drawing accuracy showing according to the second modification of the embodiment of the present invention.

FIG. 18 shows a comparative example where a fluctuation of surrounding environmental parameters is not taken into consideration. Correction parameters outside beam correction times $T_1$, $T_2$ are not corrected even when there is a fluctuation in the surrounding environment fluctuates. Thus, a fluctuation in environmental parameter causes a deterioration of drawing accuracy, as shown in FIG. 19. On the other hand, according to the second modified example of the embodiment of the present invention, as shown in FIG. 20, the main correction parameter fluctuation amount ΔP is added to the main correction parameter Pn+1 during times $T_2$, $T_3$, $T_4$, $T_6$ in which the environmental parameters fluctuate after a passage of time from the beam correction times $T_1$, $T_5$. As a result, the main correction parameter Pn+1+ΔP, that takes the environmental parameter fluctuation amounts $\Delta T_{stg}$, $\Delta P_{cr}$, and $\Delta T_{ch}$ into consideration, is predicted to correct the electron beam lithography conditions. Thus, as shown in FIG. 21, it is possible to suppress deterioration of the drawing accuracy. It is to be noted that types of environmental parameters are not limited to the stage temperature fluctuation amount $\Delta T_{stg}$, the CR pressure fluctuation amount $\Delta P_{cr}$, and the sample room temperature fluctuation amount $\Delta T_{ch}$.

(Third Modification)

Figure 22:
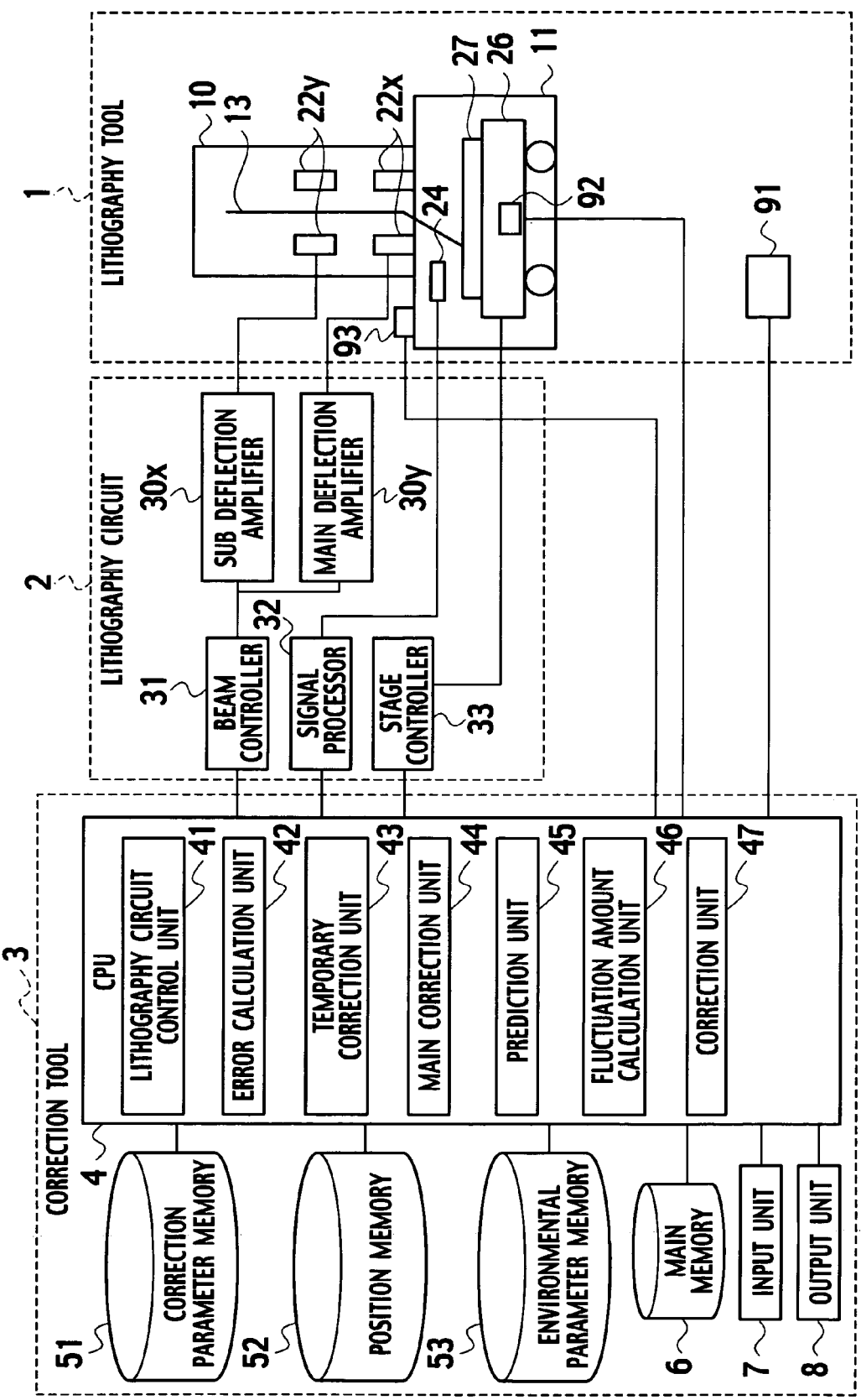
FIG. 22 is a schematic view showing an example of an electron beam drawing device according to third and fourth modifications of the embodiment of the present invention.

According to a third modification of the embodiment of the present invention, as shown in FIG. 22, a correction tool 3 of an electron beam drawing device is different from that of the electron beam drawing device shown in FIG. 15 in that it includes a correction unit 47.

The correction unit 47 includes a Kalman filter for automatically correcting a model. The Kalman filter is a standard statistic method. A prediction unit 45 calculates a main correction parameter fluctuation amount ΔP(T) as a "target variable (result)" based on environmental parameter fluctuation amounts $\Delta T_{stg}(T)$, $\Delta P_{cr}(T)$, and $\Delta T_{ch}(T)$ by using a prediction equation (7). The prediction equation (7) weights environmental parameter fluctuation amounts, such as the stage temperature fluctuation amount $\Delta T_{stg}(T)$, the CR pressure fluctuation amount $\Delta P_{cr}(T)$ and the sample room temperature fluctuation amount $\Delta T_{ch}(T)$, as "explanatory variables (causes)" most likely to contribute to the predicted target, by weighting factors C1(T) to C3(T) to linearly connect each of the environmental parameter fluctuation amounts.

$$\Delta P(T) = C1(T)\Delta T_{stg}(T) + C2(T)\Delta P_{cr}(T) + C3(T)\Delta T_{ch}(T) \qquad (7)$$

The prediction unit 45 adds the main correction parameter fluctuation amount ΔP to the main correction parameter Pn+1. As a result, the main correction parameter ΔP+ΔP(T) that takes the environmental parameter fluctuation amounts $\Delta T_{stg}(T)$, $\Delta P_{cr}(T)$, and $\Delta T_{ch}(T)$ into consideration is predicted.

An error calculation section 42 calculates an error (Δx, Δy) between an actual illumination position Pa (Xa, Ya) by using the main correction parameter ΔP+ΔP(T) which takes the environmental parameter fluctuation amounts $\Delta T_{stg}(T)$, $\Delta P_{cr}(T)$, $\Delta T_{ch}(T)$ into consideration and a target position Pd (Xd, Yd). A temporary correction unit 43 reads the error (Δx, Δy) calculated by the error calculation section 42, and calculates a temporary correction parameter P'n to minimize the error (Δx, Δy) by using a least squares method. The main correction unit 44 carries out statistical processing of the temporary correction parameter P'n calculated by the temporary correction unit 43 and the initial correction parameters Pn–i to Pn read from the correction parameter memory 51, so as to calculate a main correction parameter Pn+1.

On the other hand, the correction unit 47 compares the errors of the predicted main correction parameter ΔP+ΔP(T) and the optimal main correction parameter Pn+1 with each other to correct weighting factors C1(T), C2(T), and C3(T). As a result, a prediction equation (8) of corrected weighting factors C1(T+1), C2(T+1), and C3(T+1) is obtained.

$$\Delta P(T+1) = C1(T+1)\Delta T_{stg}(T+1) + C2\Delta(T+1)P_{cr}(T+1) + C3(T+1)\Delta T_{ch}(T+1) \quad (8)$$

Figure 23:
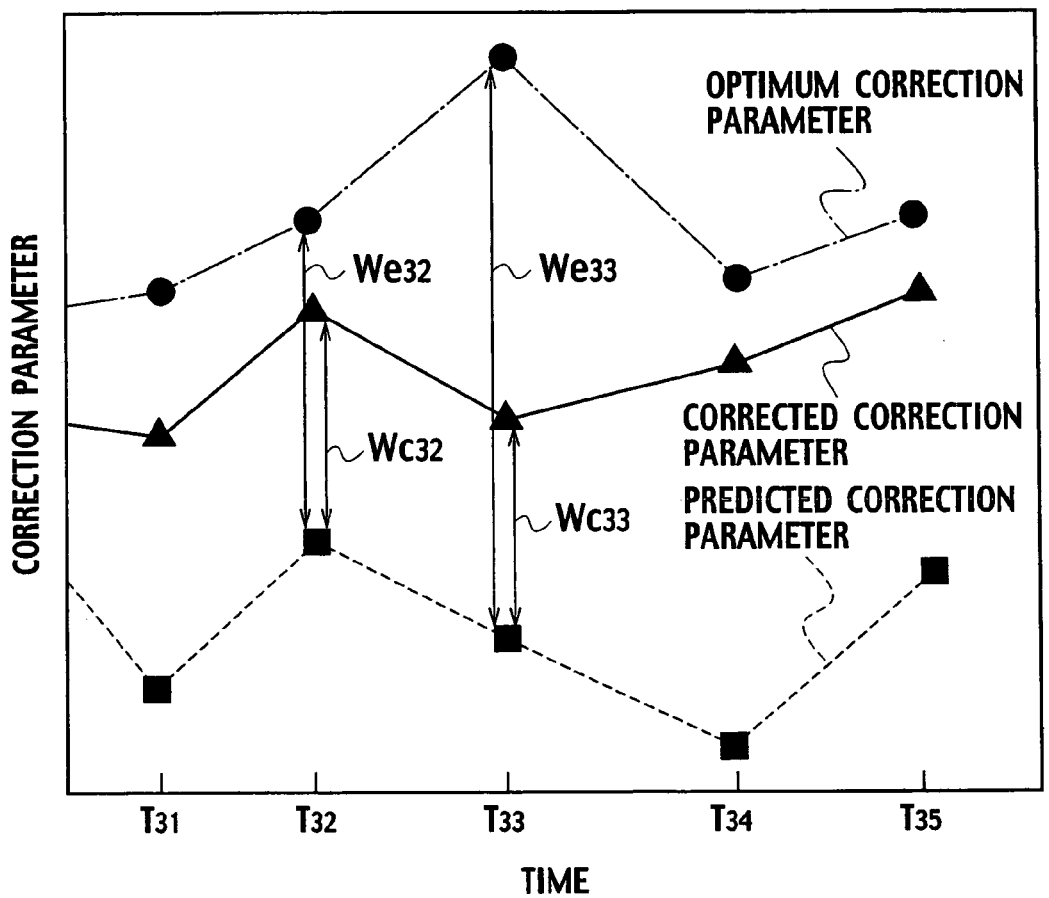
FIG. 23 is a graph for explaining a Kalman filter according to the third modification of the embodiment of the present invention.

In the next correction of the lithography conditions, the prediction unit 45 predicts main correction parameters Pn+2 ($a_{0n+2}$, $a_{1n+2}$, $a_{2n+2}$, $a_{3n+2}$, $b_{0n+2}$, $b_{1n+2}$, $b_{2n+2}$, and $b_{3n+2}$) by using the prediction equation (8). FIG. 23 shows the main correction parameter that takes the environmental parameter fluctuation amounts into consideration, as indicated by a square, the optimal main correction parameter, as indicated by a circle, and the main correction parameter predicted by using the prediction equation (7), indicated by a triangle. In this case, for example, a large correction width Wc33 is set when an error We33 is large, as in the case of time T33. Conversely, a small correction width Wc32 is set when an error We32 is small, as in the case of time T32.

In place of the deflection amplifier 30 shown in FIG. 1, a lithography circuit 2 includes a main deflection amplifier 30y for applying a deflection voltage to a main deflector 22x, and a subdeflection amplifier 30x for applying a deflection voltage to a subdeflector 22y. In the case of correcting the electron beam illumination position, the lithography conditions may be corrected by using both or one of the main deflector 22x and the subdeflector 22y.

Figure 24:
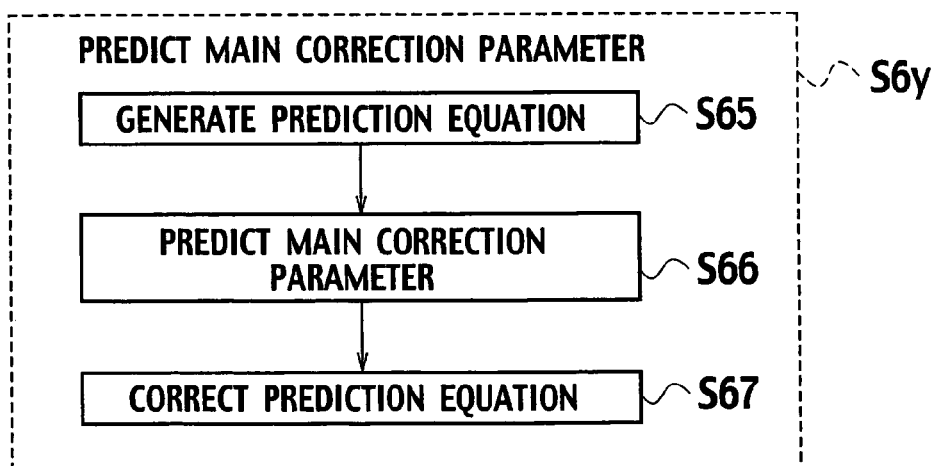
FIG. 24 is a flow chart for explaining an example of a method for drawing with an electron beam according to the third modification of the embodiment of the present invention.

Next, an electron beam drawing method according to the third modified example of the embodiment of the present invention will be described by referring to flowcharts of FIGS. 10 and 24.

The procedure of steps S1 to S6 of FIG. 10 is substantially similar to the method of the embodiment, and thus repeated explanation will be avoided. Step S6y of FIG. 10, is shown in FIG. 24. In step S65, the prediction unit 45 uses $\Delta T_{stg}(T)$, $\Delta P_{cr}(T)$, and $\Delta T_{ch}(T)$ from a previous (n-th) correction of the lithography conditions as explanatory variables, and linearly connects them by weighting factors C1(T), C2(T), and C3(T), to create a prediction equation (6).

In step S66, a fluctuation amount ΔP(T) of the main correction parameter is calculated by use of the environmental parameter fluctuation amounts $\Delta T_{stg}(T)$ $\Delta P_{cr}(T)$, and $\Delta T_{ch}(T)$. The prediction unit 45 adds the main correction parameter fluctuation amount ΔP to the predicted main correction parameter Pn+1. As a result, a main correction parameter ΔP+ΔP(T) is predicted that takes the environmental parameter fluctuation amounts $\Delta T_{stg}(T)$, $\Delta P_{cr}(T)$, and $\Delta T_{ch}(T)$ into consideration.

In step S67, the error calculation section 42 calculates an error (Δx, Δy) between an actual illumination position Pa (Xa, Ya) by using the main correction parameter ΔP+ΔP(T) and a target position Pd (Xd, Yd). The temporary correction unit 43 reads the error (Δx, Δy) calculated by the error calculation section 42, and calculates a temporary correction parameter P'n to minimize the error (Δx, Δy) by using a least squares method The main correction unit 44 carries out statistical processing of the temporary correction parameter P'n calculated by the temporary correction unit 43 and the initial correction parameters Pn–i to Pn, read from the correction parameter memory 51, to calculate a main correction parameter Pn+1. The correction unit 47 compares the errors of the main correction parameter ΔP+ΔP(T) and the optimal main correction parameter Pn+1 with each other to correct weighting factors C1(T), C2(T), and C3(T). As a result, a prediction equation (8) of corrected weighting factors C1(T+1), C2(T+1), and C3(T+1) is obtained. In the next correction of the lithography conditions, the prediction unit 45 predicts main correction parameters Pn+2 by using the prediction equation (8). Other steps are substantially similar to those of FIG. 10, and thus repeated explanation will be omitted.

According to the third modified example of the embodiment of the present invention, as the weighting factors C1(T+1), C2(T+1), and C3(T+1) of the prediction equation (8) are corrected by using the correction unit 47, which functions as a Kalman filter, it is possible to further improve drawing accuracy.

For example, the weighting factor mi of the embodiment of the present invention may be corrected by using the Kalman filter. Moreover, the factors for the time-sequential analysis in the first modified example of the embodiment of the present invention may be corrected by using the Kalman filter.

(Fourth Modification)

In an electron beam drawing device according to a fourth embodiment of the present invention, a correction unit 47 shown in FIG. 22 includes a function of a neural network for imitating a brain neural network to process information. The correction unit 47 calculates a predicted value by using the neural network, based on explanatory variables (environmental parameters). As the explanatory variables, for example, a total deflection distance, which is a total deflection distance of a beam defected by a main deflector 22x from the start of drawing, a stage travel distance from the start of the drawing, CR pressure, a CR temperature, and the like can be employed. The total deflection distance, the stage traveling distance, the CR pressure, the CR temperature, and the like can be stored in an environmental parameter memory 53.

Figure 25:
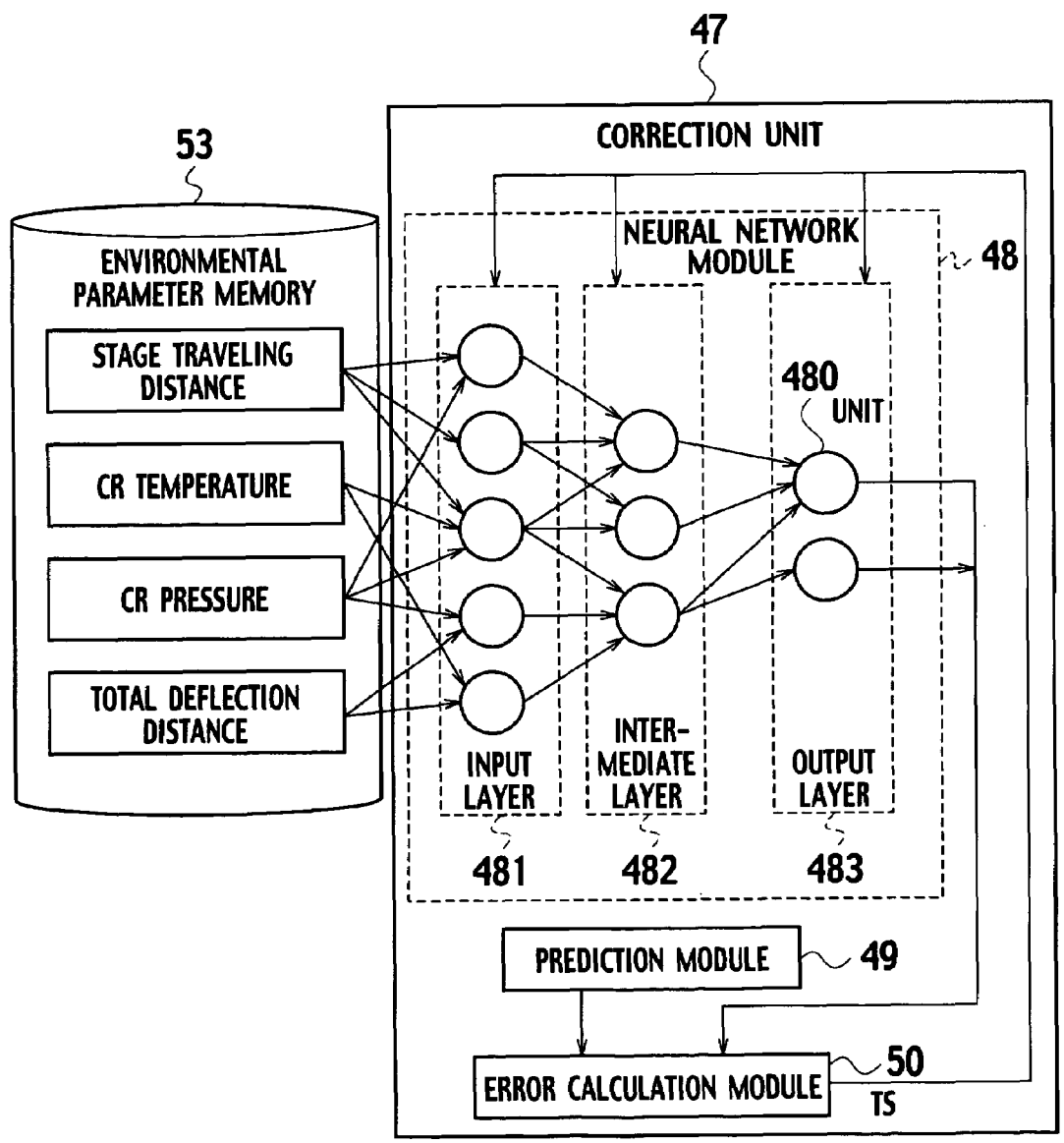
FIG. 25 is a schematic view for explaining a neural network according to the fourth modification of the embodiment of the present invention.

As shown in FIG. 25, the correction unit 47 includes a neural network module 48, a prediction module 49, and an error calculation module 50. The neural network module 48 includes an input layer 481, an intermediate layer 482, and an output layer 483, each of which has a plurality of units 480 respectively. The units 480 of the adjacent layers are connected to each other by "connection loads" (indicated by line segments). The units 480 and the connection loads nearly correspond, respectively, to a neuron and a synaptic connection in biological terminology. In statistical terminology, the unit 480 is a variable, and the connection load is a weighting factor. The neural network module 48 receives data (explanatory variables) at the time of beam corrections, of about several hundred times of beam correction, stored in the environmental parameter memory 53, as input signals. A signal between the units 480 is converted as a weighted sum in which a value of the connection load is a weighting factor to become an input signal to the next layer. The weighting factor is connection strength between the units 480. In the units 480 of the intermediate layer 482 and after, signals are converted by a sigmoid function so as to provide output. Specifically, a nonlinear continuous function to be differentiated, such as a logistic function, is used. A first weight is started from a proper initial value to calculate a last output signal (correction parameter).

The prediction module 49 predicts ideal beam correction parameters, such as a magnification and rotation, based on an observed value (real situation value) of alignment deviation when electron beams are applied. Alternatively, the prediction module 49 predicts ideal beam correction parameter based on a connection error magnification of a deflection area. The error calculation module 50 sets the ideal beam correction parameter from the prediction module 49 as a correct answer to calculate an error obtained by subtracting the correction parameter from the neural network module 48, as a teacher signal TS.

The neural network module 48 compares the last output signal (correction parameter) with the teacher signal TS. There is an error at first because of noncoincidence of the last output signal with the teacher signal TS. Calculation is repeated for optimization, based on minimization of a square sum of errors calculated by the error calculation module 50 or maximization of likelihood, and convergence of the last output signal is achieved while updating a weighting factor applied to an input signal (explanatory variable, or environmental parameter) input to the input layer 481. This process is referred to as "learning". For example, an "error reverse propagation learning law" is used to reversely correct weighting factors from the output layer 483 through the intermediate layer 482 to the input layer 481. The learning is repeated until the square sum of errors becomes a minimum to decide the number of units 480, an output hierarchy, and a hierarchical structure. An output signal obtained as a result is used as a main correction parameter.

According to the fourth modified example of the embodiment of the present invention, as the correction unit 47 corrects the weighting factors by using the neural network, it is possible to further improve drawing accuracy. It is to be noted that while the hierarchical neural network module 48 has been described as an example of a neural network, a mutual connection type neural network may be used.

(Fifth Modification)

Figure 26:
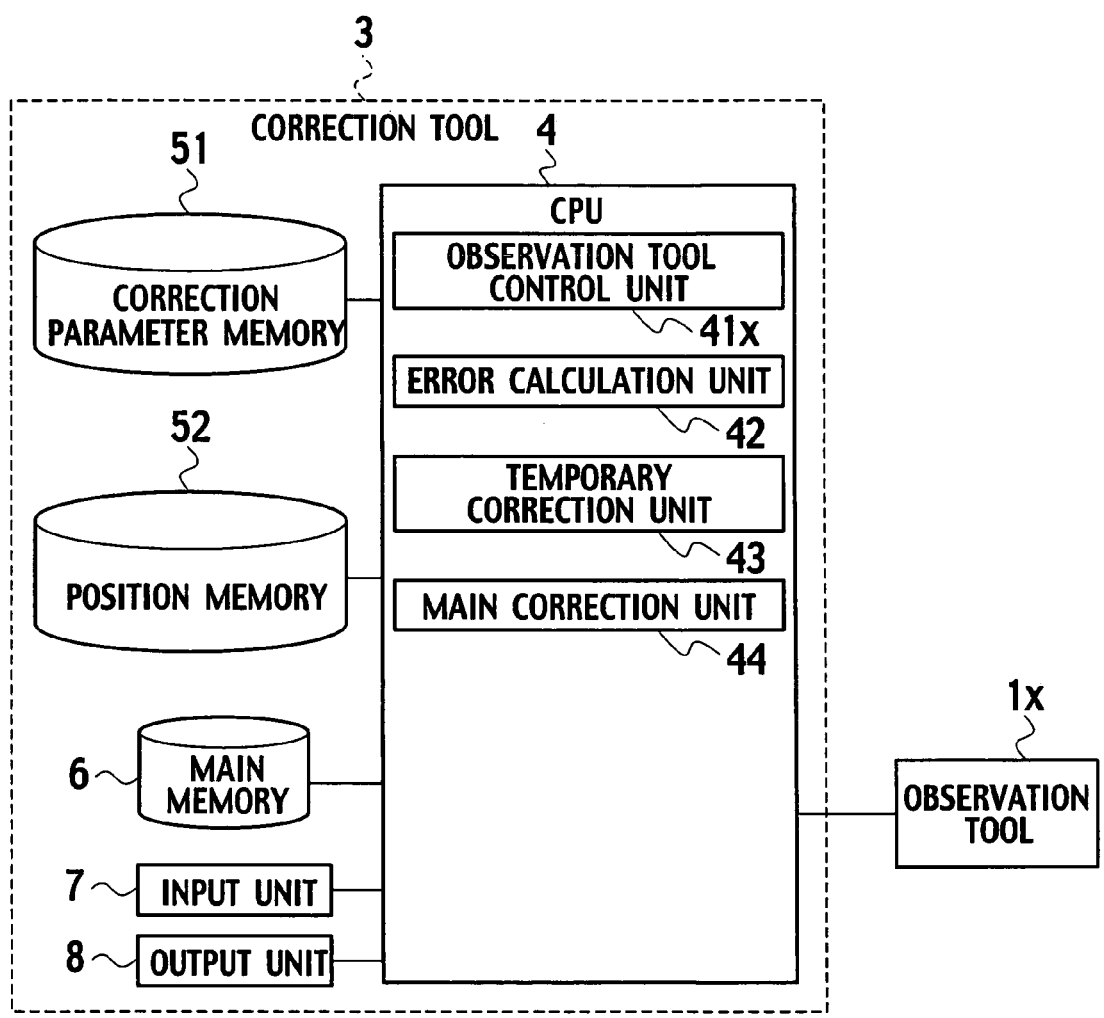
FIG. 26 is a block diagram showing an example of a correction tool according to a fifth modification of the embodiment of the present invention.

As shown in FIG. 26, a correction tool 3 according to the fifth modification of the embodiment of the present invention may be used as an observation tool 1x, which observes a shape of a surface of a substrate by using an electron beam, laser or the like.

As the observation tool 1x, a scanning electron microscope (SEM), a transmission electron microscope (TEM), a scanning transmission electron microscope (STEM), a scanning Auger electron microscope (SAM) a laser microscope, and the like can be used. For example, an image obtained by the SEM scans in a picture flame of a CRT, in synchronization with scanning an electron beam, and modulates luminance of the CRT by using reflected electrons, secondary electrons or the like generated from the surface of the substrate by an electron beam scanning. Therefore an enlarge image of the surface of the substrate is displayed on the CRT.

In a correction tool 3 shown in FIG. 26, the error calculation unit 42 calculates an error when a semiconductor pattern of a surface of a substrate is observed by using initial correction parameters for correcting observation conditions for the semiconductor pattern.

The temporary correction unit 42 calculates temporary correction parameters to decrease the error to a minimum. The main correction unit 43 executes statistical processing using the temporary correction parameters and the initial correction parameters, and calculates main correction parameters for correcting observation conditions. The observation tool control unit 41x controls the observation tool 1x using the corrected observation conditions, to observe the semiconductor pattern of the surface of the substrate.

According to the fifth modification of the embodiment of the present invention, by correcting observation conditions for the observation tool 1x, instead of an electron beam drawing device, it is possible to improve observation accuracy.

Note that the correction tool 3 shown in FIG. 26 may be installed in the observation tool 1x. Vise versa, the observation tool 1x may be installed in the correction tool 3.

OTHER EMBODIMENTS

Various modifications will become possible for those skilled in the art after receiving the teachings of the present disclosure without departing from the scope thereof.

For example, a reference mark may become stained, or a detector itself may deteriorate with time. In this case, it is necessary to adjust the level or the gain of an amplifier which amplifies a detection signal. In this case, when the level or the gain of the detector amplifier is saved (stored), time-sequential analysis maybe carried out to predict an optimal adjustment parameter. In the case of the correction unit 47, which uses the Kalman filter or the neural network, a passage of time from a previous mark changing time, the number of times of adjusting the beams, accumulated beam application time, and the like may be used as explanatory variables. In addition, the device can be applied to sensitivity adjustment of a detector for measuring a height of a wafer. In this case, a CR temperature, CR pressure, and the like are used as explanatory variables.

The present invention can be applied to detection of a positioning mark for each product. A structure of the positioning mark varies from product to product. For example, a parameter at the time of position mark detection is saved (stored) for each product. When mark detection conditions (level or gain of the detection amplifier, and voltages applied to the detector) are different between the wafer center and the wafer peripheral portion, a mark position on the wafer, a mark detection sequence, and the like may be added as explanatory variables, and an optimal parameter may be predicted by using the correction unit 47 which uses the Kalman filter or the neural network.

In positioning each product, the present invention can be used for predicting a positioning correction amount. For example, as a parameter at the time of positioning each product, an exposure wafer initial shifting amount ($\Delta$xs, $\Delta$Ys) is input. A shifting amount ($\Delta$x's, $\Delta$Y's) for each exposure wafer is predicted by a configuration of the fourth modified example of the present invention to execute the drawing. A wafer position shifting amount ($\Delta$Xz, $\Delta$Yz) after the drawing is measured, and a shifting amount ($\Delta$X's, $\Delta$Y's) can be obtained precisely for each exposure wafer by using a teacher signal.

The present invention can be applied to generation of a deflection sensitivity parameter during the drawing. In this case, a total deflection distance from the start of wafer or lot drawing (can be obtained from chip layout data and drawing data on the predesigned wafer), the total number of shots from the start of wafer or lot drawing, and a stage traveling distance from the start of wafer or lot drawing are used as explanatory variables. For example, even when a temperature of the deflection amplifier fluctuates due to a crude density of patterns in the deflection area, and a desired output voltage cannot be obtained because of temperature characteristics of an element in the deflection amplifier, highly accurate drawing can be carried out. Depending on the stage traveling state, even when the sample temperature fluctuates, highly accurate drawing can be carried out.

The present invention can be applied to generation of a lens adjustment parameter for adjusting a projection device of the exposure device. For example, when a CR temperature fluctuates, characteristics of an electric element in a lens power source are changed. Thus, an output voltage (or current) of the lens power source is changed, and a beam focusing position is changed to cause an error. In this case, by using the CR temperature as an explanatory variable, even when a change of the CR temperature causes a fluctuation in an output of the lens power source to prevent obtaining a desired output voltage (or current), it is possible to highly accurately control a focusing position and to execute highly accurate drawing.

The present invention can be applied to generation of a beam optical axis adjustment parameter. For example, a fluctuation in the CR temperature causes a change in characteristics of an optical axis adjustment coil or the electric element in the deflector power source. Thus, an output voltage (or current) of the coil or the deflector power source is changed, and a beam deflection position is changed to cause an error. In this case, by using the CR temperature as an explanatory variable, even when the change of the CR temperature causes a fluctuation in an output of the coil or the deflector power source to prevent obtaining a desired output voltage (or current), it is possible to highly accurately control an optical axis and to execute highly accurate drawing.

The aforementioned correction can be applied to an exposure device in addition to the electron beam drawing device. For example, in the case of a semiconductor exposure device that uses an excimer laser as a light source, for a gas to oscillate the laser, the accumulated time from gas exchange and the CR temperature are used as explanatory variables, and a dimension error of a drawing pattern is used as a teacher signal to predict an optical exposure amount. Accordingly, it is possible to carry out highly accurate exposure.

Figure 27:
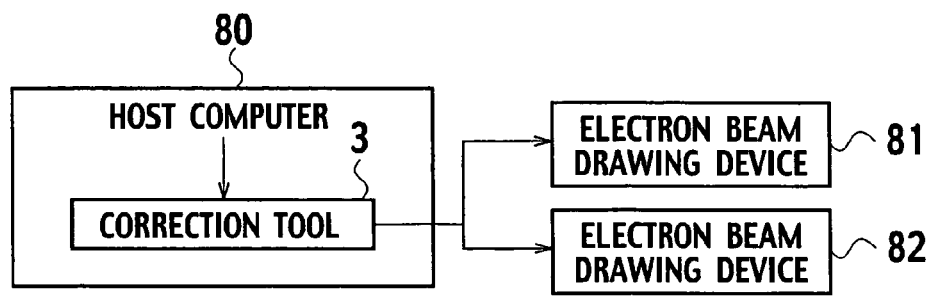
FIG. 27 is a block diagram showing an example of electron beam drawing systems according to the other embodiment of the present invention.

As shown in FIG. 27, the correction tool 3, as shown in FIG. 1, may be incorporated in a host computer 80 at a manufacturing plant. The correction tool 3 is connected to a plurality of electron beam drawing devices 81 and 82. Each of the electron beam drawing devices 81 and 82 includes the lithography tool 1 and the lithography circuit 2 shown in FIG. 1. The host computer 80 controls electron beam correction at the electron beam drawing device of the entire plant.

Figure 28:
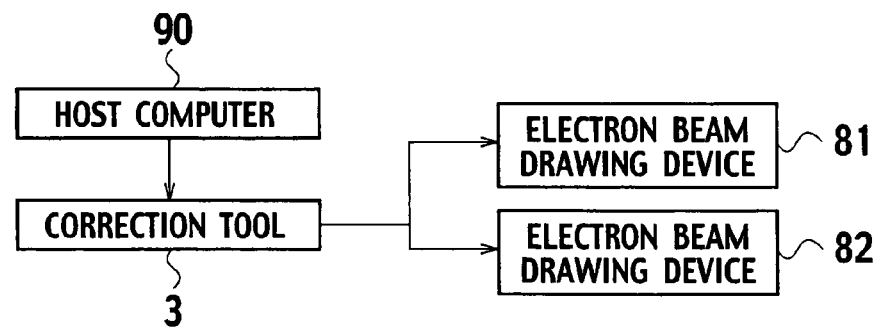
FIG. 28 is a block diagram showing another example of electron beam drawing systems according to the other embodiment of the present invention.

As shown in FIG. 28, the correction tool 3, as shown in FIG. 3, may be connected to the host computer 80 of the plant and between the plurality of electron beam drawing devices 81 and 82. The correction tool 3 controls electron beam corrections at the plurality of electron beam drawing devices 81 and 82. The correction tool 3 only needs to have information of the electron beam drawing devices 81 and 82.

Figure 29:
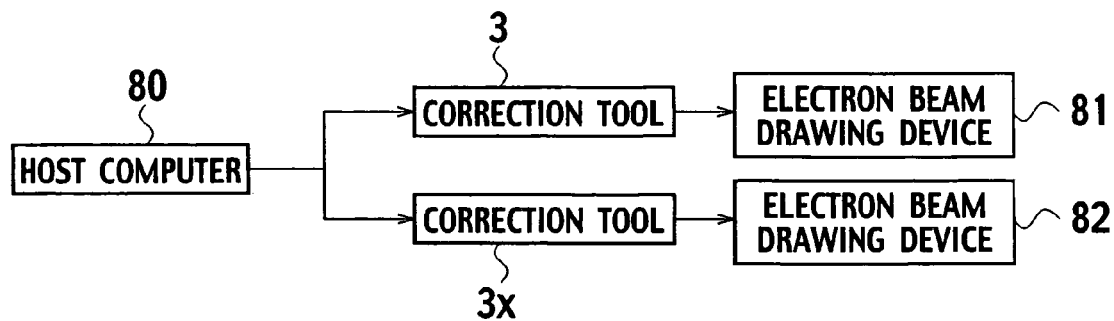
FIG. 29 is a block diagrams showing still another example of electron beam drawing systems according to the other embodiment of the present invention.

Furthermore, as shown in FIG. 29, the correction tool 3, as shown in FIG. 1, and a correction tool 3x similar in configuration to the correction tool 3 may be connected to the host computer 80 of the plant and between the electron beam drawing devices 81 and 82. The plurality of correction tools 3, and 3x control corrections of lithography conditions at the electron beam drawing devices 81 and 82. A difference from the examples of FIGS. 27 and 28 is that the plurality of correction tools 3 and 3x control only the corrections of the lithography conditions of the electron beam drawing devices 81 and 82 of which they are respectively in charge.

What is claimed is:

1. A system for correcting a charged particle beam lithography condition comprising:
   an error calculation unit configured to calculate an error in an illumination position of a charged particle beam, the charged particle beam is controlled by a lithography condition corrected by initial correction parameters;
   a temporary correction unit configured to calculate temporary correction parameters to decrease the error to a minimum; and
   a main correction unit configured to calculate main correction parameters correcting the lithography condition, by executing statistical processing using the temporary correction parameters and the initial correction parameters.

2. The system of claim 1, wherein the error calculation unit calculate the error between an actual illumination position of the charged particle beam and a target position of the charged particle beam.

3. The system of claim 1, wherein the main correction unit calculates a weighted averages of the temporary correction parameters and the initial correction parameters, as the main correction parameters.

4. The system of claim 1, further comprising a lithography tool configured to execute a drawing process using the main correction parameters.

5. The system of claim 1, further comprising a prediction unit configured to predict the main correction parameters by time-sequentially analyzing the initial correction parameters.

6. The system of claim 5, wherein the prediction unit takes into consideration an environmental parameter fluctuation amount generating a fluctuation in the illumination position of the charged particle beam.

7. The system of claim 6, wherein the environmental parameter fluctuation amount is at least one of a fluctuation amount of a temperature of a sample chamber, a fluctuation amount of a pressure inside of a clean room, and a temperature inside of the clean room.

8. The system of claim 6, wherein the prediction unit predicts the main correction parameters with a prediction equation, wherein the environmental parameter fluctuation amount is variable in the prediction equation.

9. The system of claim 8, wherein the prediction unit corrects the prediction equation based on an error between the predicted main correction parameter and the calculated main correction parameter.

10. A system for correcting a charged particle beam observation condition comprising:
    an error calculation unit configured to calculate an error in an illumination position of a charged particle beam observing a surface of a substrate, the charged particle beam is controlled by an observation condition corrected by initial correction parameters;
    a temporary correction unit configured to calculate temporary correction parameters to decrease the error to a minimum; and
    a main correction unit configured to calculate main correction parameters correcting the observation condition by executing statistical processing using the temporary correction parameters and the initial correction parameters.

11. A computer implemented method for correcting a charged particle beam lithography condition comprising:

calculating an error in an illumination position of a charged particle beam, the charged particle beam is controlled by a lithography condition corrected by initial correction parameters;

calculating temporary correction parameters to decrease the error to a minimum; and calculating a main correction parameter for correcting the lithography condition, by executing statistical processing using the temporary correction parameters and the initial correction parameters.

12. The method of claim 11, wherein calculating the error comprises:

calculating the error between an actual illumination position of the charged particle beam and the target position of the charged particle beam.

13. The method of claim 11, wherein calculating the main correction parameter comprises:

calculating a weighted average of the temporary correction parameters and the initial correction parameters, as the main correction parameters.

14. The method of claim 11, further comprising executing a drawing process by used of a corrected charged particle controlled by the main correction parameter.

15. The method of claim 11, further comprising predicting the main correction parameters by time-sequentially analyzing the initial correction parameters.

16. The method of claim 15, wherein predicting the main correction parameters comprises:

taking into consideration an environmental parameter fluctuation amount generating a fluctuation in the illumination position of the charged particle beam.

17. The method of claim 16, wherein the environmental parameter fluctuation amount is at least one of a fluctuation amount of a temperature of a sample chamber, a fluctuation amount of a pressure inside of a clean room, and a temperature inside of the clean room.

18. The method of claim 17, wherein predicting the main correction parameters comprises:

predicting the main correction parameters with a prediction equation, wherein the environmental parameter fluctuation amount is variable in the prediction equation; and correcting the prediction equation based on an error between the predicted main correction parameters and the calculated main correction parameters.

19. A computer readable medium containing a computer program comprising instructions configured to be executed by a computer for executing an application of a system for correcting a charged particle beam lithography condition, the program comprising:

instructions for calculating an error in an illumination position of a charged particle beam, the charged particle beam is controlled by a lithography condition corrected by initial correction parameters;

instructions for calculating temporary correction parameters to decrease the error to a minimum; and instructions for calculating main correction parameters correcting the lithography condition, by executing statistical processing using the temporary correction parameters and the initial correction parameters.

20. A method for manufacturing a semiconductor device comprising:

coating a resist film on a semiconductor wafer;

calculating an error in an illumination position of a charged particle beam, the charged particle beam is controlled by a lithography condition corrected by initial correction parameters, calculating temporary correction parameters to decrease the error to a minimum, calculating main correction parameters, by executing statistical processing using the temporary correction parameters and the initial correction parameters;

correcting the lithography condition using the main correction parameters; and exposing the resist film by use of a corrected charged particle beam controlled by the corrected lithography condition.

\* \* \* \* \*